United States Patent
Lee et al.

(10) Patent No.: US 12,355,471 B2
(45) Date of Patent: *Jul. 8, 2025

(54) METHOD AND APPARATUS FOR GENERATING FIXED-POINT QUANTIZED NEURAL NETWORK

(71) Applicant: Samsung Electronics Co., Ltd., Suwon-si (KR)

(72) Inventors: Junhaeng Lee, Hwaseong-si (KR); Seungwon Lee, Hwaseong-si (KR); Sangwon Ha, Seongnam-si (KR); Wonjo Lee, Uiwang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/084,948

(22) Filed: Dec. 20, 2022

(65) Prior Publication Data

US 2023/0117033 A1 Apr. 20, 2023

Related U.S. Application Data

(63) Continuation of application No. 16/051,788, filed on Aug. 1, 2018, now Pat. No. 11,588,496.

(30) Foreign Application Priority Data

Aug. 4, 2017 (KR) .................. 10-2017-0098999

(51) Int. Cl.
*H03M 7/24* (2006.01)
*G06F 7/483* (2006.01)
(Continued)

(52) U.S. Cl.
CPC .............. *H03M 7/24* (2013.01); *G06F 7/483* (2013.01); *G06F 7/49947* (2013.01);
(Continued)

(58) Field of Classification Search
CPC ....................................... H03M 7/24
See application file for complete search history.

(56) References Cited

U.S. PATENT DOCUMENTS

| 5,257,215 A | 10/1993 | Poon |
| 5,417,211 A * | 5/1995 | Abraham-Fuchs .... G16H 50/20 |
| | | 706/924 |

(Continued)

FOREIGN PATENT DOCUMENTS

| CN | 105760933 A | 7/2016 |
| CN | 106066783 A | 11/2016 |

(Continued)

OTHER PUBLICATIONS

Dong et al., "Learning Accurate Low-Bit Deep Neural Networks with Stochastic Quantization" Aug. 3, 2017, arxiv.org, arXiv:1708.01001 (Year: 2017).*

(Continued)

*Primary Examiner* — James D. Rutten
(74) *Attorney, Agent, or Firm* — NSIP Law

(57) ABSTRACT

A method of generating a fixed-point quantized neural network includes analyzing a statistical distribution for each channel of floating-point parameter values of feature maps and a kernel for each channel from data of a pre-trained floating-point neural network, determining a fixed-point expression of each of the parameters for each channel statistically covering a distribution range of the floating-point parameter values based on the statistical distribution for each channel, determining fractional lengths of a bias and a weight for each channel among the parameters of the fixed-point expression for each channel based on a result of performing a convolution operation, and generating a fixed-
(Continued)

point quantized neural network in which the bias and the weight for each channel have the determined fractional lengths.

20 Claims, 19 Drawing Sheets

(51) Int. Cl.
    *G06F 7/499*     (2006.01)
    *G06F 7/544*     (2006.01)
    *G06N 3/063*     (2023.01)
    *G06N 3/084*     (2023.01)

(52) U.S. Cl.
    CPC .......... *G06F 7/5443* (2013.01); *G06N 3/063* (2013.01); *G06F 2207/4824* (2013.01); *G06N 3/084* (2013.01)

(56) References Cited

U.S. PATENT DOCUMENTS

| | | |
|---|---|---|
| 9,916,531 B1 | 3/2018 | Zivkovic et al. |
| 10,491,239 B1 | 11/2019 | Hubara |
| 2015/0206048 A1 | 7/2015 | Talathi et al. |
| 2016/0026912 A1 | 1/2016 | Falcon et al. |
| 2016/0328645 A1 | 11/2016 | Lin et al. |
| 2016/0328646 A1 | 11/2016 | Lin et al. |
| 2016/0328647 A1 | 11/2016 | Lin et al. |
| 2016/0350645 A1 | 12/2016 | Brothers et al. |
| 2017/0102920 A1 | 4/2017 | Henry et al. |
| 2018/0211157 A1* | 7/2018 | Liu ....................... G06T 3/4007 |
| 2020/0042871 A1* | 2/2020 | Francini ................ G06F 18/214 |
| 2021/0004686 A1 | 1/2021 | Rozen et al. |

FOREIGN PATENT DOCUMENTS

| | | |
|---|---|---|
| CN | 106575379 A | 4/2017 |
| JP | 2017-509951 A | 4/2017 |
| WO | WO 2017/044214 A1 | 3/2017 |

OTHER PUBLICATIONS

Cheng, Jian, et al. "Quantized Cnn: A unified approach to accelerate and compress convolutional networks." *IEEE transactions on neural networks and learning systems* vol. 29 Issue 10 (2017): pp. 4730-4743.
Sung, Wonyong, and Ki-Il Kum. "Simulation-based word-length optimization method for fixed-point digital signal processing systems." *IEEE transactions on Signal Processing* vol. 43 Issue 12 (1995): pp. 3087-3090.
Gysel, Philipp Matthias. *Ristretto: Hardware-oriented approximation of convolutional neural networks*. University of California, Davis, 2016.
Lin, Darryl D. et al., "Fixed Point Quantization of Deep Convolutional Networks," *Proceedings of Machine Leaning Research*, vol. 48, 2016, pp. 2849-2858, proceedings of the 33rd International Conference on Machine Learning (ICML 2016), Jun. 19-24, 2016, New York, NY, paper presented Jun. 21, 2016, preprint published online at arXiv:1511.06393, first published Nov. 19, 2015, this version published Jun. 2, 2016 (10 pages in English).
Gysel, Philipp et al., "Hardware-Oriented Approximation of Convolutional Neural Networks," accepted as a workshop contribution at the Fourth International Conference on Learning Representations (ICLR 2016), May 2-4, 2016, San Juan, Puerto Rico, published online at arXiv:1604.03168, first published Apr. 11, 2016, this version published Oct. 20, 2016 (pp. 1-8 in English).
Shin, Dongjoo et al., "14.2 DNPU: An 8.1TOPS/W Reconfigurable CNN-RNN Processor for General-Purpose Deep Neural Networks," *Digest of Technical Papers of the 2017 IEEE International Solid-State Circuits Conference (ISSCC 2017)*, Feb. 2017, pp. 240-241 and continuation page, conference held Feb. 5-9, 2017, San Francisco, CA, paper presented Feb. 7, 2017 (3 pages in English).
Anwar, Sajid et al., "Fixed Point Optimization of Deep Convolutional Neural Networks for Object Recognition", *2015 IEEE International Conference on Acoustics, Speech and Signal Processing (ICASSP)*, Aug. 2015, (pp. 1131-1135).
Extended European Search Report issued on Jan. 9, 2019 in corresponding European Patent Application No. 18187235.9 (8 pages in English).
Y. You, *Audio Coding: Theory and Applications*, 2010, Chapter 2, "Scalar Quantization," pp. 19-42.
Ryu Takeda et al., "Acoustic Model Training Based on Node-Wise Weight Boundary Model Increasing Speed of Discrete Neural Networks," *Proceedings of the 2015 IEEE Workshop on Automatic Speech Recognition and Understanding (ASRU 2015)*, 2015, pp. 52-58, conference held Dec. 13-17, 2015, Scottsdale, Arizona.
Japanese Notice of Grounds of Rejection issued on Sep. 14, 2021, in counterpart Japanese Patent Application No. 2018-144829 (11 pages in English, 9 pages in Japanese).
Bao, Jian, et al., "Optimization of Neural Network with Fixed-Point Number Weights and its Application," Journal of Computer Applications, vol. 29, No. 1, Jan. 2009, (Abstract in English, 4 Pages in Chinese).
Korean Office Action Issued on Jan. 31, 2023, in Counterpart Korean Patent Application No. 10-2017-0098999 (4 Pages in English, 5 Pages in Korean).
Chinese Office Action Issued on Mar. 30, 2023, in Counterpart Chinese Patent Application No. 201810868446.4 (7 Pages in English, 8 Pages in Chinese).

* cited by examiner

FIG. 4
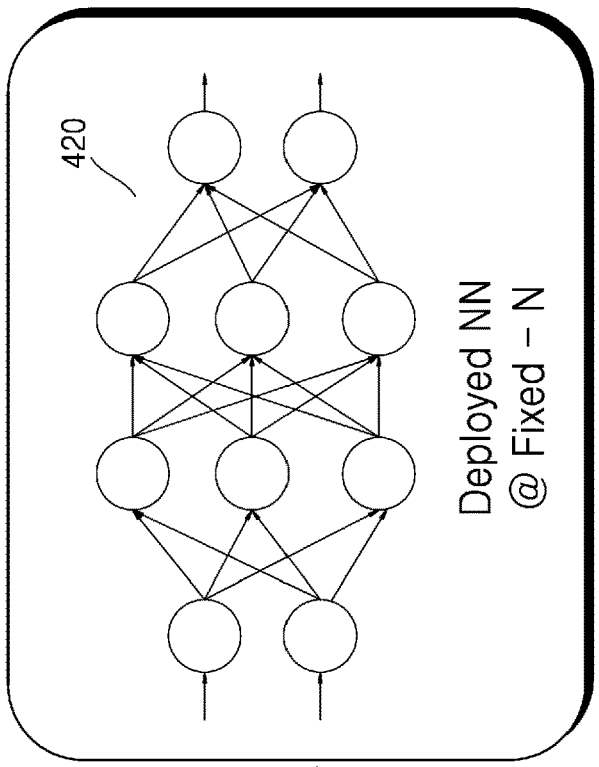
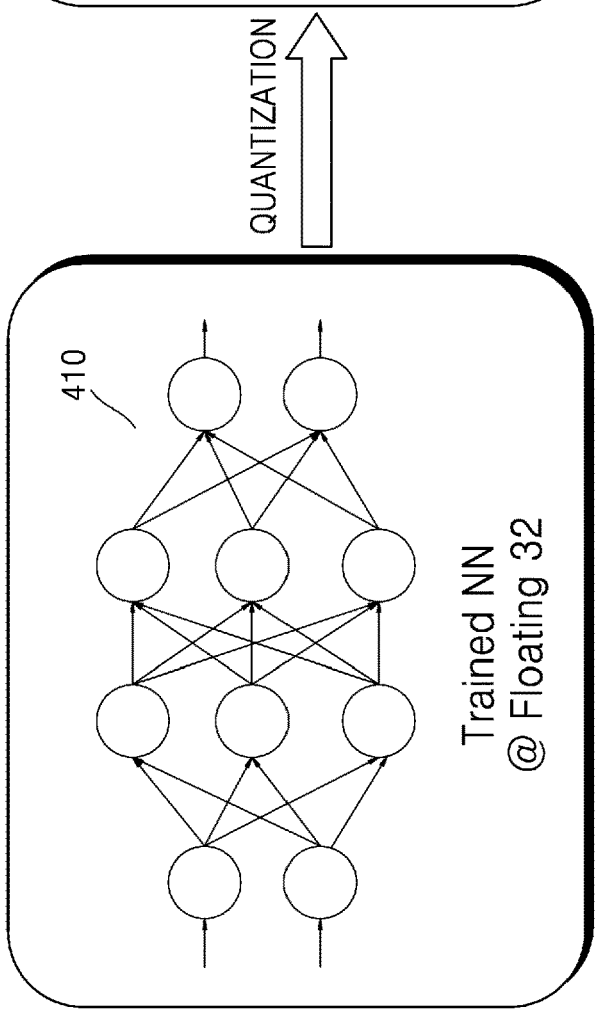

FIG. 5
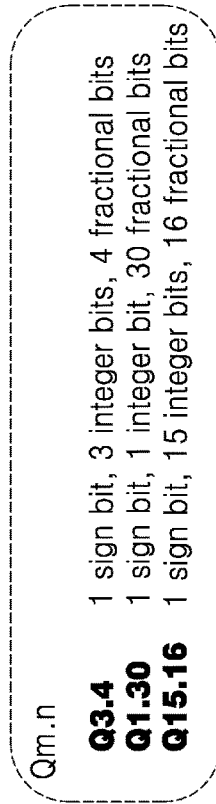
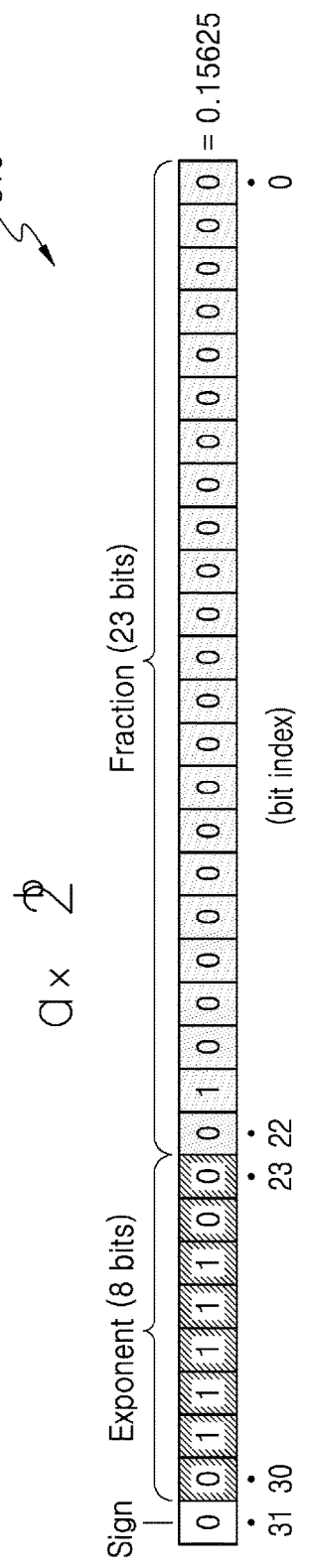
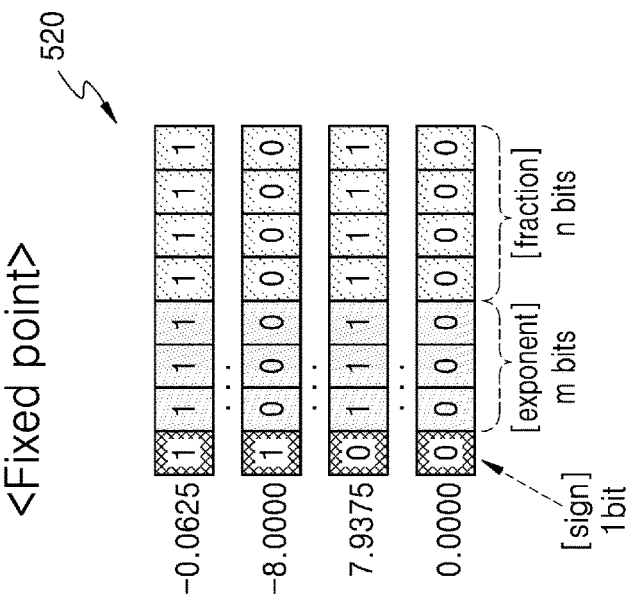

1. Profiling weights and activations
1401 → inputs: net arch, net params (weights, biases), train_data (input and output activations)
1402 → outputs_1: statistics of weights for each channel, statistics of input and output activations for each channel

2. Calculating ch-wise fractional lengths
1403 → inputs: outputs_1
       algorithm:
1404 →   calculate $fl^{ker}$ for each channel from statistics of weights for each channel
1405 →   calculate $fl^{in}$, $fl^{out}$ for each channel from statistics of input and output activations for each channel
1406 →   $fl_{i,j}^{pSum} := fl_{j}^{ker} + fl_{i}^{in}$ for all (i,j) pairs of input and output channels
1407 →   $fl_{j}^{adder} := \min_{i} fl_{i,j}^{pSum}$ for each j
1408 →   $fl_{j}^{bias} := fl_{j}^{adder}$
1409 →   $fl_{j}^{ker} \leftarrow fl_{i,j}^{ker} - (fl_{i,j}^{pSum} - fl_{j}^{adder})$
         $shift_j = fl_{j}^{bias} - fl_{j}^{out}$
1410 → outputs_2: $fl^{in}$, $fl^{out}$, $fl^{ker}$, $fl^{bias}$, shift $fl^{ker}$: frac. len. for kernel
$fl^{in}$: frac. len. for ifm
$fl^{out}$: frac. len. for ofm
$fl^{pSum}$: frac. len. for ch-wise partial sum
$fl^{adder}$: frac. len. for ofm adder
$fl^{bias}$: frac. len. for bias
shift: # of bit shift after adder

3. Quantizing and saving net params
1411 → inputs: $fl^{ker}$, $fl^{bias}$
1412 → outputs_3: quantized net params

4. Testing inference accuracy
1413 → inputs: net arch, outputs_3, $fl^{in}$, $fl^{out}$, val_data
1414 → outputs: accuracy LW: layer-wise
FCW: fully channel-wise
MAX: max value are used for fractional lengths
Opt: optimum deltas are used for fractional lengths
mean+3sigma: mean+3sigma values are used as virtual max values for
 fractional lengths

METHOD AND APPARATUS FOR GENERATING FIXED-POINT QUANTIZED NEURAL NETWORK

CROSS-REFERENCE TO RELATED APPLICATIONS

This application is a continuation of U.S. patent application Ser. No. 16/051,788 filed on Aug. 1, 2018, which claims the benefit of Korean Patent Application No. 10-2017-0098999 filed on Aug. 4, 2017, in the Korean Intellectual Property Office, the entire disclosure of which is incorporated herein by reference for all purposes.

BACKGROUND

1. Field

This application relates to a method and apparatus for quantizing parameters of a neural network.

2. Description of Related Art

A neural network is a computational architecture that calculates output data based on input data. An apparatus for processing a neural network performs a huge number of operations on complex input which makes it difficult to analyze a large amount of input data and extract desired information using a neural network in real time.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of generating a fixed-point quantized neural network includes analyzing a statistical distribution for each channel of floating-point parameter values of feature maps and a kernel for each channel from data of a pre-trained floating-point neural network; determining a fixed-point expression of each of the parameters for each channel statistically covering a distribution range of the floating-point parameter values based on the statistical distribution for each channel; determining fractional lengths of a bias and a weight for each channel among the parameters for each channel based on a result of performing a convolution operation; and generating a fixed-point quantized neural network in which the bias and the weight for each channel have the determined fractional lengths.

The analyzing of the statistical distribution may include obtaining statistics for each channel of floating-point parameter values of weights, input activations, and output activations used in each channel during pre-training of the pre-trained floating-point neural network.

The convolution operation may include a partial sum operation between a plurality of channels, the partial sum operation may include a plurality of multiply-accumulate (MAC) operations and an Add operation, and the determining of the fractional lengths may include determining the fractional length of the bias based on fractional lengths of input activations and fractional lengths of weights input to the MAC operations.

The determining of the fractional length of the bias may include determining the fractional length of the bias based on a maximum fractional length among fractional lengths of fixed-point expressions corresponding to results of the MAC operations.

The partial sum operation may include a first MAC operation between a first input activation of a first channel of an input feature map of the feature maps and a first weight of a first channel of the kernel; a second MAC operation between a second input activation of a second channel of the input feature map and a second weight of a second channel of the kernel; and an Add operation between a result of the first MAC operation, a result of the second MAC operation, and the bias, and the determining of the fractional length of the bias may further include obtaining a first fractional length of a first fixed-point expression corresponding to the result of the first MAC operation; obtaining a second fractional length of a second fixed-point expression corresponding to the result of the second MAC operation; and determining the fractional length of the bias to be a maximum fractional length among the first fractional length and the second fractional length.

The method may further include bit-shifting a fractional length of a fixed-point expression having a smaller fractional length among the first fixed-point expression and the second fixed-point expression based on the determined fractional length of the bias, and the fixed-point quantized neural network may include information about an amount of the bit-shifting.

The determining of the fractional length of the bias may include determining the fractional length of the bias to be a minimum fractional length among fractional lengths of fixed-point expressions respectively corresponding to results of the MAC operations, and the determining of the fractional lengths may further include determining the fractional length of the weight for each channel by decreasing the fractional length of the weight by a difference between the fractional length of one of the fixed-point expressions corresponding to the result of one of the MAC operations to which the weight was input and the determined fractional length of the bias.

The partial sum operation may include a first MAC operation between a first input activation of a first channel of an input feature map of the feature maps and a first weight of a first channel of the kernel; a second MAC operation between a second input activation of a second channel of the input feature map and a second weight of a second channel of the kernel; and an Add operation between a result of the first MAC operation, a result of the second MAC operation, and the bias, the determining of the fractional lengths may further include obtaining a first fractional length of a first fixed-point expression corresponding to the result of the first MAC operation; and obtaining a second fractional length of a second fixed-point expression corresponding to the result of the second MAC operation, the determining of the fractional length of the bias may include determining the fractional length of the bias to be a minimum fractional length among the first fractional length and the second fractional length, and the determining of the fractional lengths may further include tuning a fractional length of the weight input to one of the first MAC operation and the second MAC operation that produces a result having a fixed-point expression having the minimum fractional length by decreasing the fractional length of the weight by a difference between the first fractional length and the second fractional length.

The statistical distribution for each channel may be a distribution approximated by a normal distribution or a Laplace distribution, and the determining of the fixed-point expression of each of the parameters for each channel may include determining the fixed-point expression based on a fractional length for each channel determined based on any one or any combination of any two or more of a mean, a variance, a standard deviation, a maximum value, and a minimum value of the parameter values for each channel obtained from the statistical distribution for each channel.

The method may further include retraining, after the determining of the fractional lengths is completed, the fixed-point quantized neural network with the determined fractional lengths of the bias and the weight for each channel set as constraints of the fixed-point quantized neural network to fine tune the fixed-point quantized neural network.

In another general aspect, a non-transitory computer-readable medium stores instructions that, when executed by a processor, cause the processor to perform the method described above.

In another general aspect, an apparatus for generating a fixed-point quantized neural network includes a memory configured to store at least one program; and a processor configured to execute the at least one program, wherein the processor executing the at least one program configures the processor to analyze a statistical distribution for each channel of floating-point parameter values of feature maps and a kernel for each channel from data of a pre-trained floating-point neural network, determine a fixed-point expression of each of the parameters for each channel statistically covering a distribution range of the floating-point parameter values based on the statistical distribution for each channel, determine fractional lengths of a bias and a weight for each channel among the parameters for each channel based on a result of performing a convolution operation, and generate a fixed-point quantized neural network in which the bias and the weight for each channel have the determined fractional lengths.

The processor may be further configured to analyze the statistical distribution by obtaining statistics for each channel of floating-point parameter values of weights, input activations, and output activations used in each channel during pre-training of the pre-trained floating-point neural network.

The convolution operation may include a partial sum operation between a plurality of channels, the partial sum operation may include a plurality of multiply-accumulate (MAC) operations and an Add operation, and the processor may be further configured to determine the fractional length of the bias based on fractional lengths of input activations and fractional lengths of weights input to the MAC operations.

The processor may be further configured to determine the fractional length of the bias based on a maximum fractional length among fractional lengths of fixed-point expressions corresponding to results of the MAC operations.

The partial sum operation may include a first MAC operation between a first input activation of a first channel of an input feature map of the feature maps and a first weight of a first channel of the kernel; a second MAC operation between a second input activation of the input feature map and a second weight of a second channel of the kernel; and an Add operation between a result of the first MAC operation, a result of the second MAC operation, and the bias, and the processor may be further configured to obtain a first fractional length of a first fixed-point expression corresponding to the result of the first MAC operation, obtain a second fractional length of a second fixed-point expression corresponding to the result of the second MAC operation, and determine the fractional length of the bias to be a maximum fractional length among the first fractional length and the second fractional length.

The processor may be further configured to bit-shift a fractional length of a fixed-point expression having a smaller fractional length among the first fixed-point expression and the second fixed-point expression based on the determined fractional length of the bias, and the fixed-point quantized neural network may include information about an amount of the bit-shifting.

The processor may be further configured to determine the fractional length of the bias to be a minimum fractional length among fractional lengths of fixed-point expressions respectively corresponding to results of the MAC operations, and determine the fractional length of the weight for each channel by decreasing the fractional length of the weight by a difference between the fractional length of one of the fixed-point expressions corresponding to the result of one of the MAC operations to which the weight was input and the determined fractional length of the bias.

The partial sum operation may include a first MAC operation between a first input activation of an input feature map of the feature maps and a first weight of a first channel of the kernel; a second MAC operation between a second input activation of a second channel of the input feature map and a second weight of a second channel of the kernel; and an Add operation between a result of the first MAC operation, a result of the second MAC operation, and the bias, and the processor may be further configured to obtain a first fractional length of a first fixed-point expression corresponding to the result of the first MAC operation, obtain a second fractional length of a second fixed-point expression corresponding to the result of the second MAC operation, determine the fractional length of the bias to be a minimum fractional length among the first fractional length and the second fractional length, and tune a fractional length of the weight input to one of the first MAC operation and the second MAC operation that produces a result having a fixed-point expression having the minimum fractional length by decreasing the fractional length of the weight by a difference between the first fractional length and the second fractional length.

The statistical distribution for each channel may be a distribution approximated a normal distribution or a Laplace distribution, and the processor may be further configured to determine the fixed-point expression of each of the parameters for each channel based on a fractional length for each channel determined based on any one or any combination of any two or more of a mean, a variance, a standard deviation, a maximum value, and a minimum value of the parameter values for each channel obtained from the statistical distribution for each channel.

The processor may be further configured to retrain, after the determining of the fractional lengths is completed, the fixed-point quantized neural network with the determined fractional lengths of the bias and the weight for each channel set as constraints of the fixed-point quantized neural network to fine tune the fixed-point quantized neural network.

In another general aspect, a method of generating a fixed-point quantized neural network includes determining a fixed-point expression of an input activation for each channel of an input feature map used in a pre-trained floating-point neural network based on a statistical distribution of floating-point values of the input activation for each channel of the input feature map in training data used to train the pre-trained floating-point neural network; determining a fixed-point expression of an output activation for each channel of an output feature map used in the pre-trained floating-point neural network based on a statistical distribution of floating-point values of the output activation for each channel of the output feature map in the training data used to train the pre-trained floating-point neural network; determining a fixed-point expression of a weight for each channel of a kernel used in the pre-trained floating-point neural network based on a statistical distribution of floating-point values of the weight for each channel of the kernel in data of the pre-trained floating-point neural network; determining a fractional length of a bias used in the pre-trained floating-point neural network based on a result of a convolution operation performed based on input activations of the input feature map and weights of the kernel; and generating a fixed-point quantized neural network in which the bias has the determined fractional length.

The convolution operation may include a first multiply-accumulate (MAC) operation between a first input activation of a first channel of the input feature map and a first weight of a first channel of the kernel; a second MAC operation between a second input activation of a second channel of the input feature map and a second weight of a second channel of the kernel; and an Add operation between a result of the first MAC operation, a result of the second MAC operation, and the bias.

The determining of the fractional length of the bias may include determining the fractional length of the bias to be a maximum fractional length among a first fractional length of a first fixed-point expression corresponding to a result of the first MAC operation and a second fractional length of a second fixed-point expression corresponding to a result of the second MAC operation.

The method of claim may further include increasing the fractional length of one of the first fractional length and the second fractional length having a minimum fractional length among the first fractional length and the second fractional length by bit-shifting the fractional length having the minimum fractional length by a number of bits equal to a difference between the first fractional length and the second fractional length, and the fixed-point quantized neural network may include the number of bits of the bit-shifting.

The determining of the fractional length of the bias may include determining the fractional length of the bias to be a minimum fractional length among a first fractional length of a first fixed-point expression corresponding to a result of the first MAC operation and a second fractional length of a second fixed-point expression corresponding to a result of the second MAC operation.

The method may further include determining which one of the first MAC operation and the second MAC operation produces a result having a maximum fractional length among the first fractional length and the second fractional length; determining a new fractional length of one of the first weight and the second weight that was input to the one of first MAC operation and the second MAC operation that produces the result having the maximum fractional length to be equal to an existing fractional length of the one of the first weight and the second weight minus a difference between the first fractional length and the second fractional length; and requantizing the one of the first weight and the second weight to have the new fractional length.

Other features and aspects will be apparent from the following detailed description, the drawings, and the claims.

BRIEF DESCRIPTION OF THE DRAWINGS

FIG. 4 illustrates an example in which a pre-trained neural network is quantized by a neural network quantization apparatus and deployed by a hardware accelerator.

FIG. 5 illustrates examples of a floating-point value and fixed-point values.

FIG. 14 illustrates another example of a channel-wise quantization algorithm of neural network parameters implementing the method of FIG. 13.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
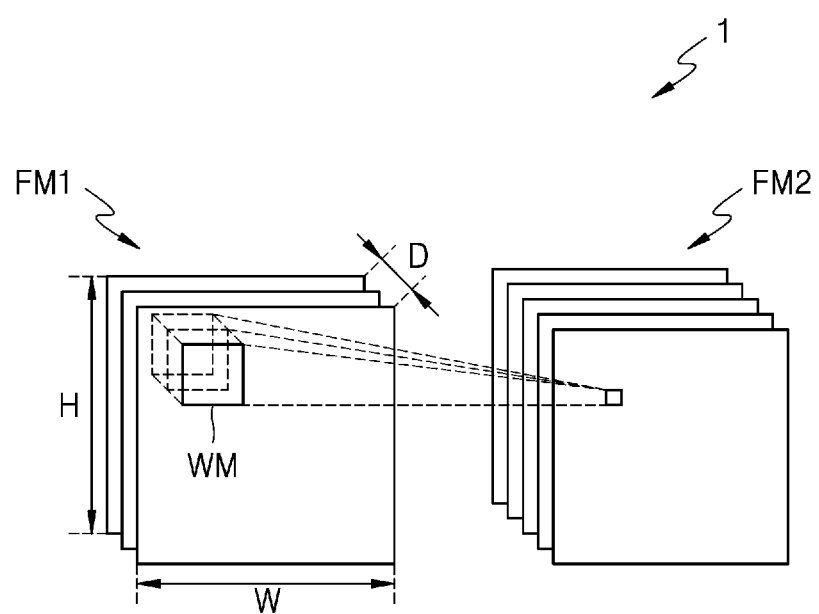
FIG. 1 illustrates an example of an architecture of a computational graph.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which the disclosure of this application pertains based on an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates an example of an architecture of a computational graph.

Referring to FIG. 1, a computational graph 1 is a graph showing a mathematical model represented by nodes and edges. The architecture of the computational graph 1 may correspond to the architecture of a neural network, or may correspond to the architecture of various other models. A neural network may be a deep neural network (DNN) or an n-layer neural network. A DNN or an n-layer neural network may be, for example, a convolutional neural network (CNN), a recurrent neural network (RNN), a deep belief network, or a restricted Boltzman machine. For example, the neural network may be implemented as a CNN, but is not limited thereto. When the computational graph 1 of FIG. 1 represents a CNN, the computational graph 1 corresponds to some layers of the CNN. Accordingly, the computational graph 1 may correspond to a convolutional layer, a pooling layer, or a fully connected layer of the CNN. In the following description, for convenience of explanation, it is assumed that the computational graph 1 corresponds to a convolutional layer of the CNN, but is not limited thereto, and the computational graph 1 may correspond to representations of other mathematical models.

In the convolutional layer, a first feature map FM1 is an input feature map, and a second feature map FM2 is an output feature map. A feature map is a set of data expressing various features of input or output data. The feature maps FM1 and FM2 may be high-dimensional matrices of two or more dimensions, and each may include activation parameters. When the feature maps FM1 and FM2 are for example, three-dimensional feature maps, each of the feature maps FM1 and FM2 a width W (or a number of columns), a height H (or a number of rows), and a depth D. The depth D may be correspond to a number of channels.

In the convolutional layer, a convolution operation is performed between the first feature map FM1 and a weight map WM to generate the second feature map FM2. The weight map WM filters the first feature map FM1, and may be referred to as a filter or a kernel. The depth of the weight map WM, that is, the number of channels of the weight map WM, is equal to a product of the depth of the first feature map FM1 and the depth of the second feature map FM2, that is a product of the number of channels of the first feature map FM1 and the number of channels of the second feature map FM2. The weight map WM is shifted to slide over an entire area of the first feature map FM1, acting as a sliding window. Each time the weight map WM is shifted, each of the weights included in the weight map WM is multiplied by a feature value of the first feature map FM1 at a corresponding position in an area of the first feature map FM1 overlapped by the weight map WM, and then the products of all of the multiplications are added together to obtain a corresponding feature value of the second feature map FM2 at a position corresponding to the position of the weight map WM. As the first feature map FM1 and the weight map WM are convolved with each other, a channel of the second feature map FM2 is generated. Although FIG. 1 illustrates one weight map WM, in actuality a plurality of weight maps are convolved with the first feature map FM1 to generate a plurality of channels of the second feature map FM2. Zero padding may be added around the border of the first feature map FM1 and the border of the second feature map FM2 when necessary or desirable. However, for simplicity, a detailed discussion of the zero padding has been omitted.

The second feature map FM2 of the convolution layer may be an input feature map of a next layer. For example, the second feature map FM2 may be an input feature map of a pooling layer.

Figure 2:
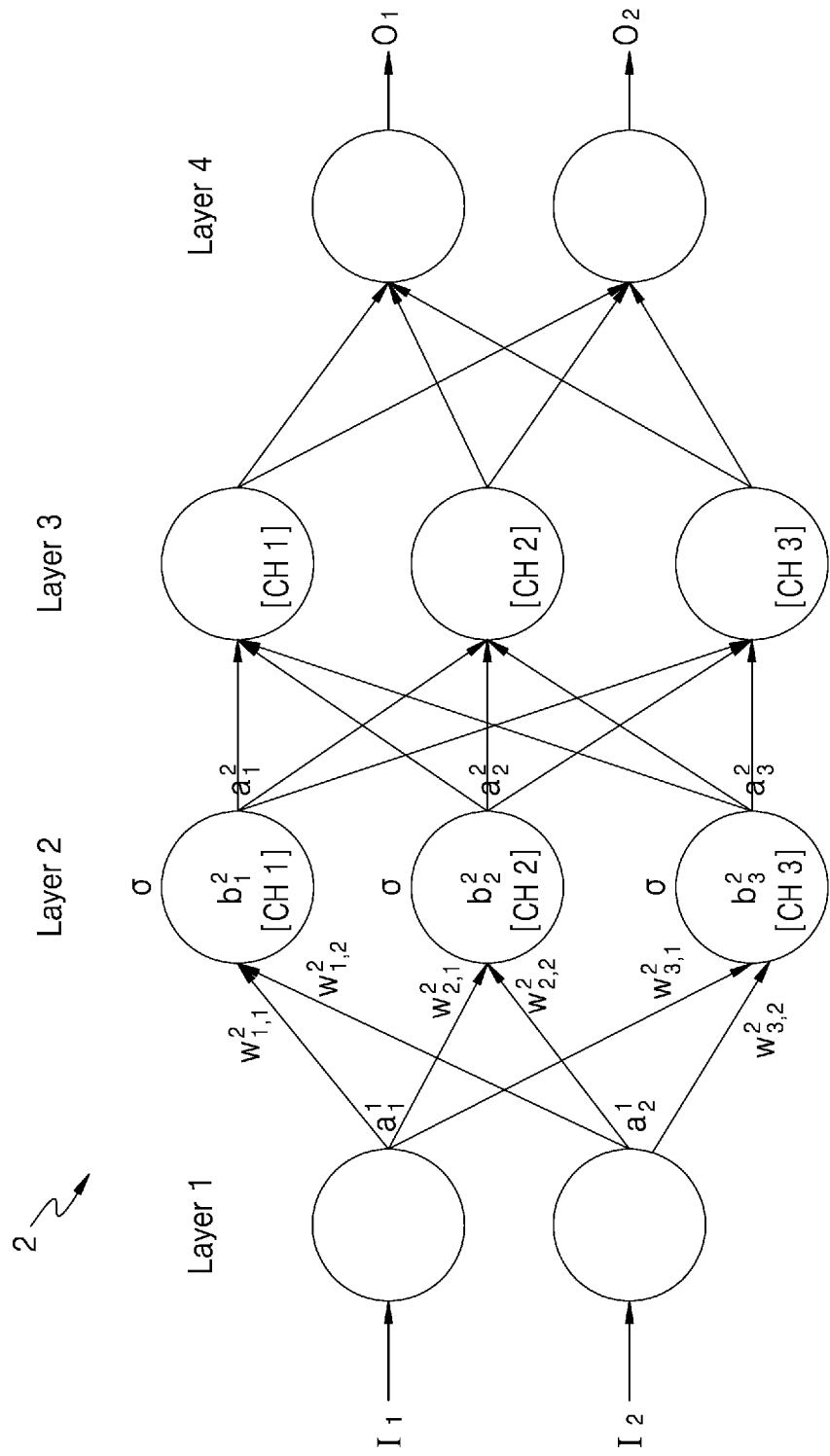
FIG. 2 illustrates an example of an operation performed in a neural network.

FIG. 2 illustrates an example of an operation performed in a neural network.

Referring to FIG. 2, a neural network 2 has a structure of including an input layer, hidden layers, and an output layer, performs an operation based on received input data, for example, $I_1$ and $I_2$, and generates output data, for example, $O_1$ and $O_2$, based on a result of the operation.

The neural network 2 may be, as described above, a DNN or an n-layer neural network including two or more hidden layers. In the example illustrated in FIG. 2, the neural network 2 is a DNN including an input layer Layer 1, two hidden layers Layer 2 and Layer 3, and an output layer Layer 4. When the neural network 2 is implemented by a DNN, the neural network 2 includes multiple hidden layers for effectively processing information, which enables the neural network 2 to process more complicated data sets than a neural network having a single hidden layer. Although the neural network 2 is illustrated as including four layers, this is merely an example, and the neural network 2 may include more or fewer layers, or more or fewer channels. In other words, the neural network 2 may include layers having various structures different from the structure illustrated in FIG. 2.

Each of the layers included in the neural network 2 includes a plurality of channels. The channels correspond to a plurality of artificial nodes known as neurons, processing elements (PE), units, or other terms. For example, as illustrated in FIG. 2, each of Layer 1 and Layer 4 includes two channels (nodes), and each of Layer 2 and Layer 3 includes three channels (nodes). However, this is merely an example, and each of the layers included in the neural network 2 may include other numbers of channels (nodes).

The channels in the layers of the neural network 2 are connected to channels in other layers to process data. For example, one channel may receive data from other channels, perform an operation on the data, and output an operation result to other channels.

The input of each of the channels may be referred to as an input activation, and the output of each of the channels may be referred to as an output activation. In other words, an activation is a parameter that is an output of one channel and is simultaneously an input of one or more other channels included in the next layer. Each of the channels determines its own activation based on the activations and weights received from channels included in the previous layer. A weight is a parameter used to calculate an output activation in each channel, and is a value allotted to a connection between two channels.

Each of the channels is processed by a computational unit or a processing element that receives an input activation and outputs an output activation, and the input activation and the output activation of each of the channels are respectively mapped to input feature map and an output feature map. For example, when "$\sigma$" denotes an activation function, "$W_{jk}^i$" denotes a weight from a k-th channel included in an (i−1)-th layer to a j-th channel included in an i-th layer, "$a_k^{i-1}$" denotes an output activation of the k-th channel included in the (i−1)-th layer, which is also an input activation of the j-th channel included in the i-th layer, $b_j^i$ denotes a bias of the j-th channel included in the i-th layer, and "$a_j^i$" denotes an output activation of the j-th channel included in the i-th layer, the output activation $a_j^i$ may be calculated according to Equation 1 below.

$$a_j^i = \sigma\left(\sum_k \left(w_{jk}^i \times a_k^{i-1}\right) + b_j^i\right) \qquad 1$$

As illustrated in FIG. 2, an output activation of the first channel CH 1 of the second layer Layer 2 is denoted by "$a_1^2$". Furthermore, "$a_1^2$" has a value of "$a_1^2 + \sigma(W_{1,1}^2 \times a_1^1 + W_{1,2}^2 \times a_2^1 + b_1^2)$" according to Equation 1. However, the above-described Equation 1 is merely an example for describing the activations, weights, and bias used to process data in the neural network 2, and the neural network 2 is not limited thereto. For example, the activation may be a value obtained by passing, through a rectified linear unit (ReLU), a value obtained by applying an activation function to a sum of activations received from a previous layer.

As described above, in the neural network 2, numerous data sets are exchanged between a plurality of channels interconnected with one another, and undergo numerous operations while passing through layers. Accordingly, this application discloses technology that decreases the number of operations needed to process complicated input data and simultaneously reduces a loss of accuracy of the neural network 2.

Figure 3:
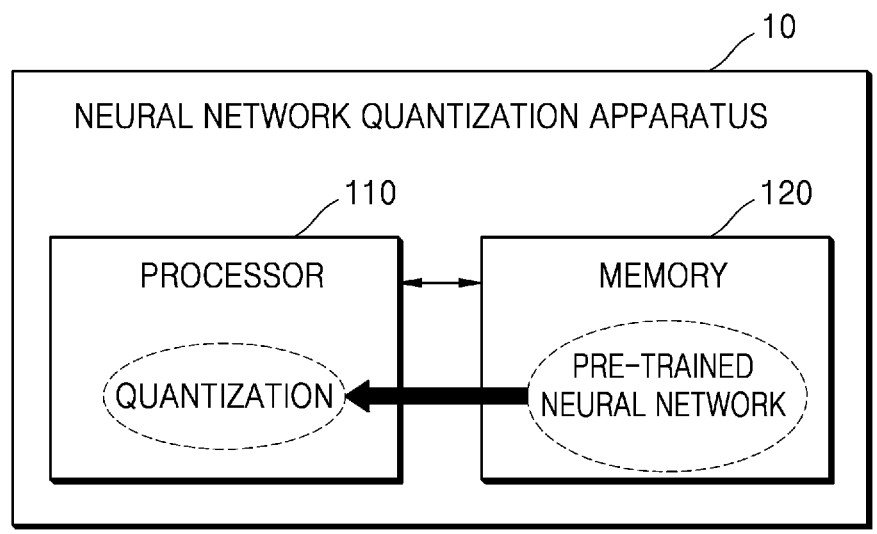
FIG. 3 is a block diagram of an example of a hardware configuration of a neural network quantization apparatus.

FIG. 3 is a block diagram of an example of a hardware configuration of a neural network quantization apparatus.

Referring to FIG. 3, a neural network quantization apparatus 10 includes a processor 110 and a memory 120. In the neural network quantization apparatus 10 of FIG. 3, only constituent elements related to the example of FIG. 3 are illustrated for convenience of description. However, the neural network quantization apparatus 10 may further include common constituent elements in addition to the constituent elements illustrated in FIG. 3.

The neural network quantization apparatus 10 is a computing device having various processing functions such as functions to generate a floating-point neural network, train the floating-point neural network, quantize the floating-point neural network to obtain a fixed-point neural network, and retrain the fixed-point neural network. For example, the neural network quantization apparatus 10 may be implemented in various types of devices such as personal computers (PCs), server devices, and mobile devices.

The processor 110 performs all functions to control the neural network quantization apparatus 10. For example, the processor 110 controls all functions of the neural network quantization apparatus 10 by executing one or more programs stored in the memory 120. The processor 110 may be implemented by a central processing unit (CPU), a graphics processing unit (GPU), or an application processor (AP) provided in the neural network quantization apparatus 10. However, the processor 110 is not limited thereto.

The memory 120 is hardware for storing various pieces of data processed in the neural network quantization apparatus 10. For example, the memory 120 may store data that has been processed and data that is to be processed in the neural network quantization apparatus 10. Furthermore, the memory 120 may store applications and drivers to be executed by the neural network quantization apparatus 10. The memory 120 may be DRAM, but is not limited thereto. The memory 120 may include either one or both of volatile memory and nonvolatile memory. Examples of the nonvolatile memory include read-only memory (ROM), programmable ROM (PROM), electrically programmable ROM (EPROM), electrically erasable and programmable ROM (EEPROM), flash memory, phase-change random-access memory (RAM) (PRAM), magnetic RAM (MRAM), resistive RAM (RRAM), and ferroelectric RAM (FeRAM). Examples of the volatile memory include dynamic RAM (DRAM), static RAM (SRAM), synchronous DRAM (SDRAM), PRAM, MRAM, RRAM, and ferroelectric RAM (FeRAM). In one example, the memory 120 may include any one or any combination of any two or more of a hard disk drive (HDD), a solid-state drive (SSD), a Compact-Flash™ (CF) card, a Secure Digital (SD) card, a Micro Secure Digital (microSD) card, a Mini Secure Digital (miniSD) card, an eXtreme Digital Picture (xD-Picture) card, and a Memory Stick.

The processor 110 generates a trained neural network by repeatedly training an initial neural network. To ensure accurate calculations, the initial neural network has floating-point parameters, for example, parameters of 32-bit floating-point precision. The parameters include various types of data input to and output from the neural network, for example, input activations, weights, biases, and output activations of a neural network. As the training of the neural network is repeated, the floating-point parameters of the neural network are tuned to produce a more accurate output for a given input.

However, the floating-point parameters necessitate a relatively large number of operations and relatively frequent memory accesses compared to fixed-point parameters. In particular, most of the operations performed in processing a neural network are convolution operations for performing convolutions between various parameters. Accordingly, in mobile devices such as smart phones, tablets, and wearable devices, and embedded devices that have a relatively low processing performance, processing of a neural network having floating-point parameters may not be smooth. As a result, to drive a neural network within an allowable accuracy loss while sufficiently reducing a number of operations in the above devices, the floating-point parameters of the trained neural network are quantized. In this application, "quantization of parameters" refers to a conversion of floating-point parameters to fixed-point parameters.

The neural network quantization apparatus 10 performs quantization of floating-point parameters of a trained neural network to fixed-point parameters having a certain number of bits, considering processing performance of a device, for example, a mobile device or an embedded device, that deploys the neural network, and the neural network quantization apparatus 10 transmits a quantized neural network to the device that deploys the neural network. The device that deploys the neural network may be, for example, an autonomous vehicle, a smart phone, a tablet device, an augmented reality (AR) device, or an Internet of Things (IoT) device that performs voice recognition or image recognition using a neural network, but the device is not limited thereto.

The processor 110 acquires data of a pre-trained floating-point neural network stored in the memory 120. The pre-trained neural network is implemented by data that has been repeatedly trained with floating-point parameters. The neural network may be trained by repeatedly inputting training set data first and then repeatedly inputting test set data, but the training is not limited thereto. The training set data is input data for performing initial training of the neural network, and the test set data is input data that is independent of the training set data for performing additional training of the neural network to increase an accuracy of the neural network. During both the initial training and the additional training, the performance of the neural network is measured and the training is continued until a desired accuracy is obtained.

The processor 110 analyzes, from the data of the pre-trained neural network, a statistical distribution for each channel of floating-point parameter values used in respective channels included in each of feature maps and a kernel. The processor 110 analyzes the statistical distribution for each channel by obtaining statistics for each channel of floating-point parameter values of weights, input activations, and output activations used in each channel during the pre-training of the neural network.

The processor 110 determines a fixed-point expression of a parameter for each channel statistically covering a distribution range of parameter values based on the analyzed statistical distribution for each channel. Accordingly, the floating-point neural network is converted to a fixed-point neural network. According to this example, since the conversion from the floating-point neural network to the fixed-point neural network is performed based on the statistical distribution for each channel, the fixed-point expression allotted to each channel may be the same as or different from the fixed-point expressions allotted to the other channels. In other words, a fractional length of the fixed-point expression of a parameter for each channel may be the same as or different from fractional lengths of the fixed-point expressions of parameters for the other channels. In other words, a fixed-point expression and a fractional length of the fixed-point expression are independently determined for each parameter for each channel, that is, they are determined on a channel-wise basis for each parameter.

Furthermore, the processor 110 determines the fractional lengths of the bias and the weight for each channel based on a result of performing the convolution operation between the feature maps and the kernel with parameters of the fixed-point expressions for each channel. The fractional length of the bias and the fractional length of the weight for each channel are set to be constraints of the quantized neural network.

Examples of algorithms for quantizing a floating-point parameters for each channel to fixed-point parameters using the processor 110 are described below in detail with respect to FIGS. 11 through 14.

The memory 120 stores neural network-related data sets that have been processed or are to be processed by the processor 110, for example, data of an untrained initial neural network, data of a neural network generated in a training process, data of a neural network for which training has been completed, and data of a quantized neural network. Also, the memory 120 stores various programs related to training algorithms and quantization algorithms of a neural network to be executed by the processor 110.

FIG. 4 illustrates an example in which a pre-trained neural network is quantized by a neural network quantization apparatus and deployed by a hardware accelerator.

Referring to FIG. 4, as described above, in the neural network quantization apparatus (10 of FIG. 3) such as a PC or a server, the processor (110 of FIG. 3), which may be a GPU, pre-trains a floating-point neural network 410, for example, a 32-bit floating-point neural network. The neural network 410 that is pre-trained cannot be efficiently processed in a low power or low performance hardware accelerator because of its floating-point parameters. Accordingly, the processor 110 of the neural network quantization apparatus 10 quantizes the floating-point neural network 410 to a fixed-point neural network 420, for example, a 16-bit or low fixed-point type. The hardware accelerator is dedicated hardware for driving the neural network 420. Since the hardware accelerator is implemented with relatively low power or low performance hardware, it may be optimized for a fixed-point operation rather than a floating-point operation. The hardware accelerator may be, for example, a neural processing unit (NPU), a tensor processing unit (TPU), or a neural engine, which are dedicated devices for driving a neural network, but the hardware accelerator is not limited thereto.

The hardware accelerator for driving the quantized neural network 420 may be implemented in a separate device that is independent of the neural network quantization apparatus 10. However, the hardware accelerator is not limited thereto, and the hardware accelerator may be implemented in the same device as the neural network quantization apparatus 10.

FIG. 5 illustrates examples of a floating-point value and fixed-point values.

Referring to FIG. 5, a floating-point value 510 is expressed as "$a \times 2^b$", in which "a" is a fractional part and "b" is an exponent part. The floating-point value 510 is expressed by 32 bits including a 1-bit sign part, an 8-bit exponent part, and a 23-bit fractional part.

Furthermore, fixed-point values 520 are expressed by "Qm.n", where m and n are natural numbers. In the expression "Qm.n", "m" denotes the number of bits indicating the exponent part, and "n" denotes the number of bits indicating the fractional part. Accordingly, a bit width of a fixed-point value is (1+m+n) obtained by summing a 1-bit sign part, an m-bit exponent part, and an n-bit fractional part. Since bits of the fixed-point bits indicating the fractional part are n bits, a fractional length is n. For example, "Q3.4" is a total 8-bit fixed-point value including a 1-bit sign part, a 3-bit exponent part, and a 4-bit fractional part, "Q1.30" is a total 32-bit fixed-point value including a 1-bit sign part, a 1-bit exponent part, and a 30-bit fractional part, and "Q15.16" is a total 32-bit fixed-point value including a 1-bit sign part, a 15-bit exponent part, and a 16-bit fractional part.

Figure 6:
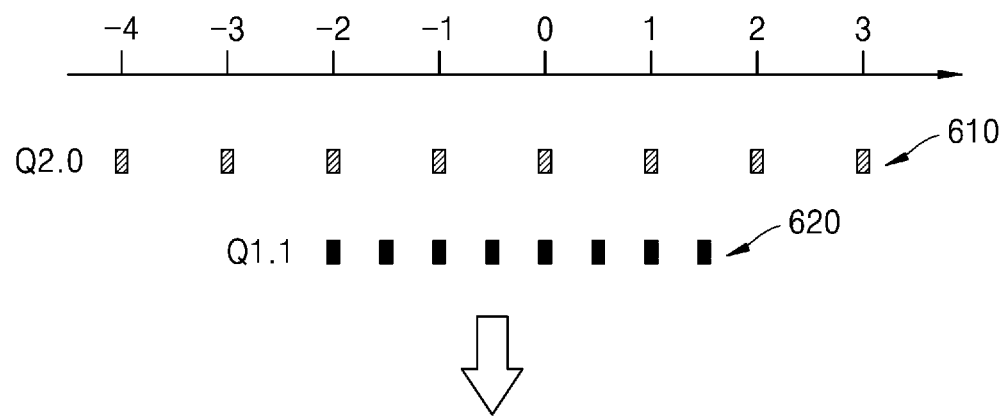
FIG. 6 illustrates an example of a relationship between fractional length and accuracy a fixed-point value.

FIG. 6 illustrates an example of a relationship between fractional length and accuracy of a fixed-point value.

Referring to FIG. 6, assuming that the total bit width allotted to a fixed-point value is 3 bits, a fixed-point expression 610 of Q2.0 in which the fractional length is 0 and a fixed-point expression 620 of Q1.1 in which the fractional length is 1 are compared to each other.

For Q2.0, since the exponent part is 2 bits and the fractional part is 0 bits, fixed-point values from −4 to 3 may be expressed, and an interval between the possible fixed-point values is 1. For Q1.1, since the exponent part is 1 bit and the fractional part is 1 bit, fixed-point values from −2 to 1.5 may be expressed, and an interval between the possible fixed-point values is 0.5.

As can be seen from the comparison, although 3 bits are allotted to both the fixed-point expression 610 of Q2.0 and the fixed-point expression 620 of Q1.1, Q2.0 is able to express a wider range of fixed-point values than Q1.1., but has a lower accuracy because the interval between the fixed-point values is wider. On the other hand, Q1.1 is able to express a narrower range of fixed-point values than Q2.0, but has a higher accuracy because the interval between the fixed-point values is narrower. Consequently, it may be seen that the accuracy of a fixed-point value depends on the fractional length of the fixed-point value, that is, the number of fractional bits allotted to the fixed-point value.

Figure 7:
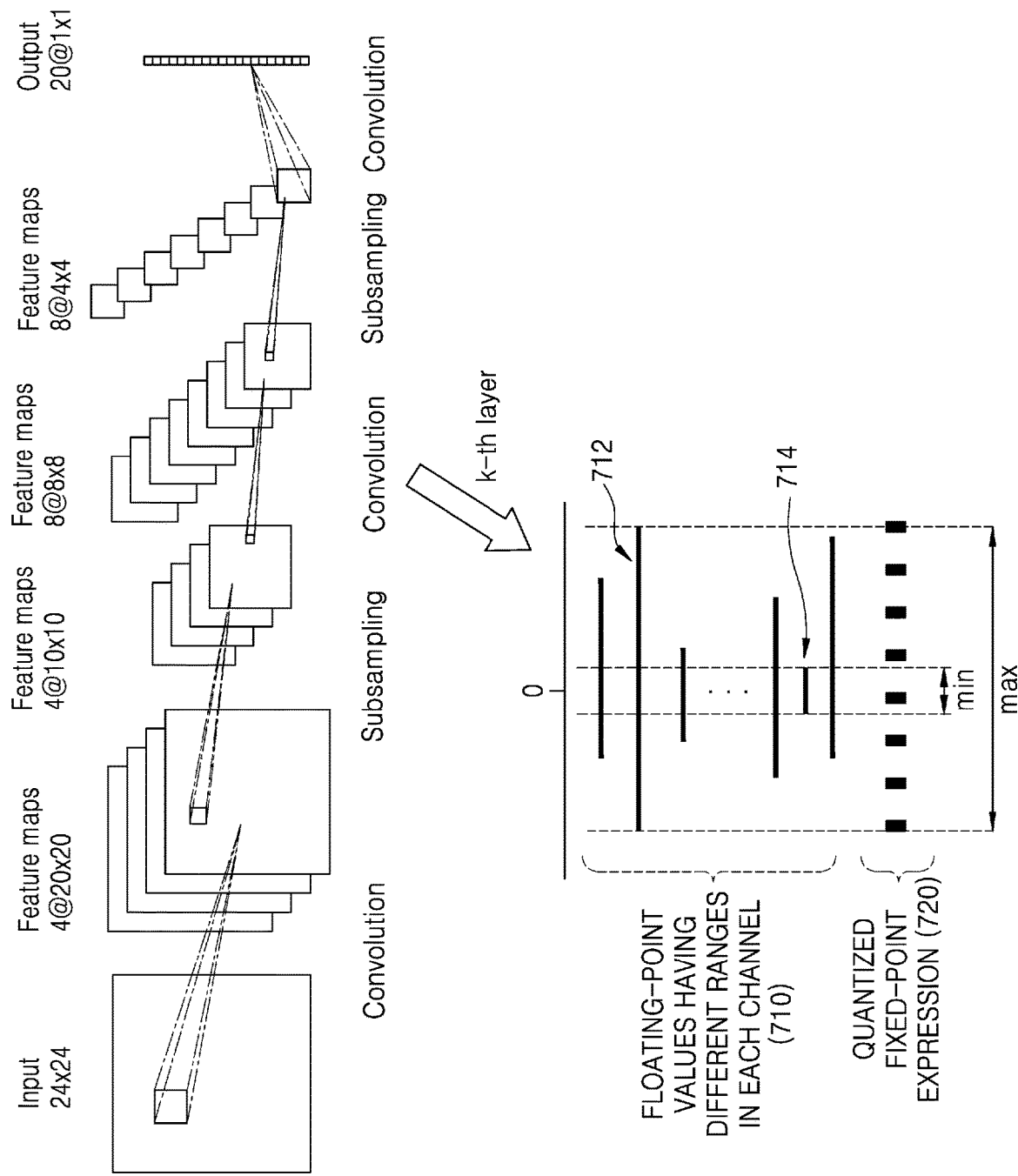
FIG. 7 illustrates an example of a layer-wise quantization in which parameters of all channels of a layer of a neural network are quantized to the same fixed-point expression.

FIG. 7 illustrates an example of a layer-wise quantization in which parameters of all channels of a layer of a neural network are quantized to the same fixed-point expression.

Referring to FIG. 7, a k-th layer of a neural network 700 includes a plurality of channels, and various floating-point values 710 having different ranges are used in the channels. If fixed-point quantization is performed for the k-th layer based on a maximum floating-point value 712 among the floating-point values 710 used in the k-th layer, the accuracy of a fixed-point expression quantized from a minimum floating-point value 714 will be very low. Conversely, if fixed-point quantization is performed based on the minimum floating-point value 714, the accuracy of a fixed-point expression quantized from the maximum floating-point value 712 will be very low. Accordingly, if quantization is performed with the same fixed-point expression for each layer, that is, for all channels included in the layer, that is, quantization is performed with a fixed-point expression having the same fractional length for each layer, that is, for all channels included in the layer, the accuracy of the quantized neural network will be lowered.

Figure 8:
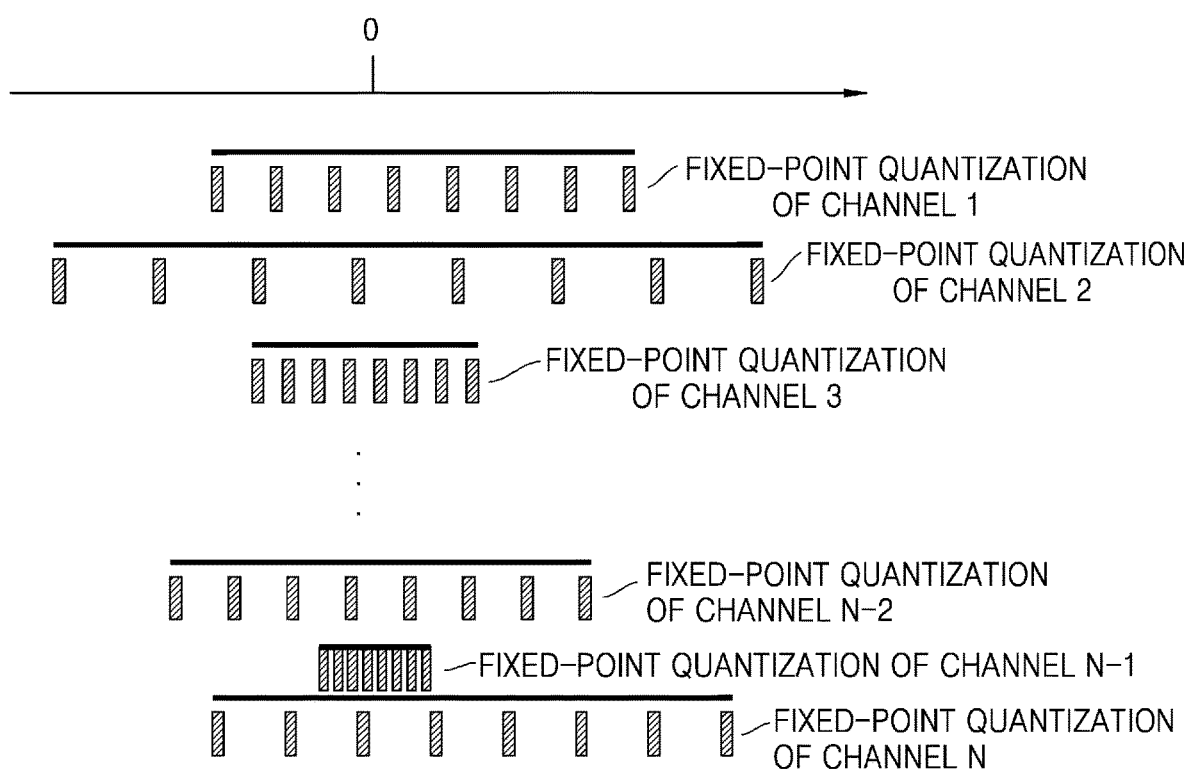
FIG. 8 illustrates an example of a channel-wise quantization in which parameters of different channels of a layer of a neural network are quantized to different fixed-point expressions.

FIG. 8 illustrates an example of a channel-wise quantization in which parameters of different channels of a layer of a neural network are quantized to different fixed-point expressions.

Referring to FIG. 8, fixed-point quantization is individually performed for each channel included in each layer of a neural network. For example, in any layer of the neural network, a distribution range of floating-point parameter values used in channel 1 and a distribution range of floating-point parameter values used in channel 2 may be different from each other. Accordingly, when the floating-point parameters of each of channel 1 and channel 2 are quantized to parameters of fixed-point expressions having different fractional lengths, the accuracy loss described with reference to FIG. 7 can be retrieved.

Accordingly, the processor 110 of FIG. 3 quantizes the floating-point parameters of channel 1 to a fixed-point expression having a fractional length that statistically covers a distribution range of the floating-point parameter values of channel 1. Furthermore, the processor 110 quantizes the floating-point parameters of each of the other channels to a fixed-point expression having a fractional length that statistically covers a distribution range of the floating-point parameter values of each of the other channels. In other words, the quantization of the floating-point parameters to the fixed-point parameters is individually performed on a channel-wise basis for each channel included in a layer of a neural network. The processor 110 performs quantization for each channel of a pre-trained neural network using this method.

Figure 9:
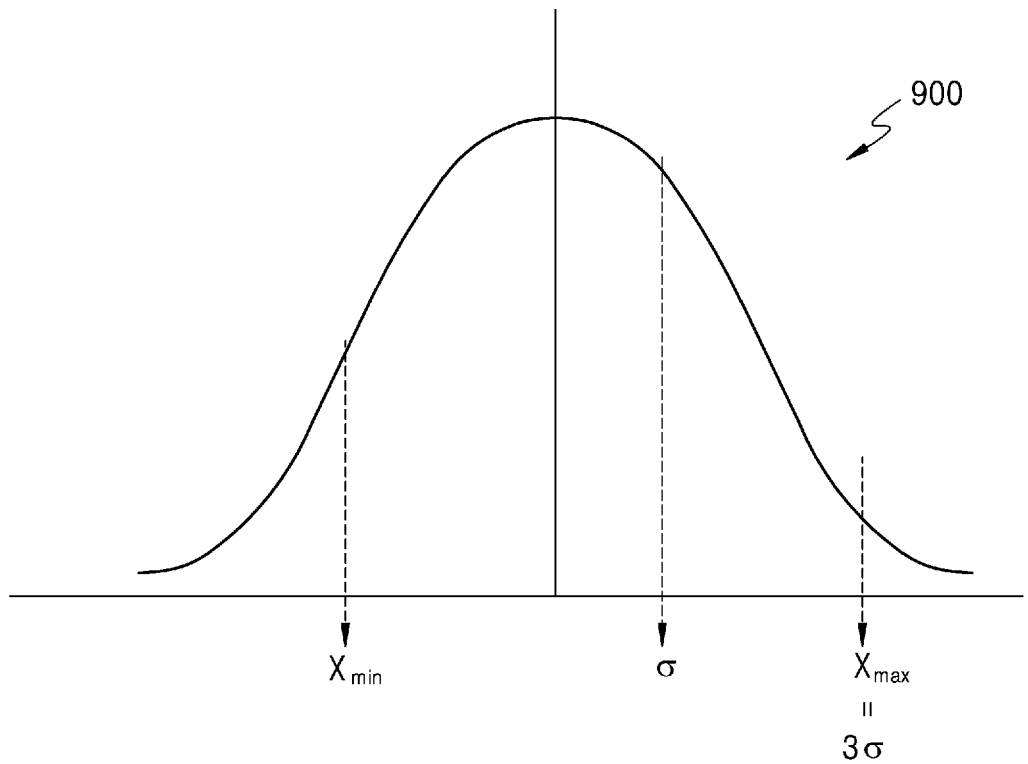
FIG. 9 is a graph showing an example of a statistical distribution of parameters used in a channel.

FIG. 9 is a graph showing an example of a statistical distribution of parameters used in a channel.

Referring to FIG. 9, after the repeated training of a neural network having floating-point parameters, a distribution of intrinsic floating-point values, that is, parameter values, is generated for each channel included in a layer. The processor 110 of FIG. 3 analyzes, from pre-trained neural network data, a statistical distribution for each channel based on statistics of floating-point parameter values of feature maps for each channel and kernels for each channel. In detail, the processor 110 obtains, from the pre-trained neural network data, statistics for each channel of floating-point parameter values of weights, input activations, and output activations, and normalizes the statistics for each channel with a probability density function (PDF) of a normal (Gaussian) distribution 900. However, although FIG. 9 illustrates an example in which, for convenience of explanation, the processor 110 normalizes the statistics with the PDF of the normal distribution 900, the processor 110 is not limited thereto. In other words, the processor 110 may analyze the statistics by using various types of statistical distributions or probability distributions other than the normal distribution 900. The normal distribution 900 of FIG. 9 may be a distribution of floating-point activation values in a channel included in any one feature map, or a distribution of floating-point weight values in a channel included in a kernel.

The processor 110 determines a quantization level based on the normal distribution 900 so that parameters of a channel are quantized to a fixed-point expression having a certain fractional length. In detail, the processor 110 obtains a statistical maximum value $X_{max}$ and a statistical minimum value $X_{min}$ of parameters in the normal distribution 900, and determines a fixed-point expression capable of statistically covering floating-point values in a range between the statistical maximum value $X_{max}$ and the statistical minimum value)(min. In this state, the fractional length is determined with the quantization level.

The statistical maximum value $X_{max}$ and the statistical minimum value $X_{min}$ are values based on a range in which a quantization error is minimized. The statistical maximum value $X_{max}$ and the statistical minimum value $X_{min}$ may be defined in various ways. For example, the statistical maximum value $X_{max}$ and the statistical minimum value $X_{min}$ may be an actual maximum parameter value and an actual minimum parameter value of parameters in the normal distribution 900. Alternatively, the statistical maximum value $X_{max}$ and the statistical minimum value $X_{min}$ may be upper and lower limits obtained based on the mean, variance, or standard deviation of the normal distribution 900, and probabilistically reducing a quantization error. Many methods of calculating an optimal range to reduce a quantization error from the PDF of a given normal distribution are known, and thus will not be described in detail here. In the examples, a fixed-point expression appropriate to the given normal distribution 900 may be determined by adopting any of the known methods.

Figure 10:
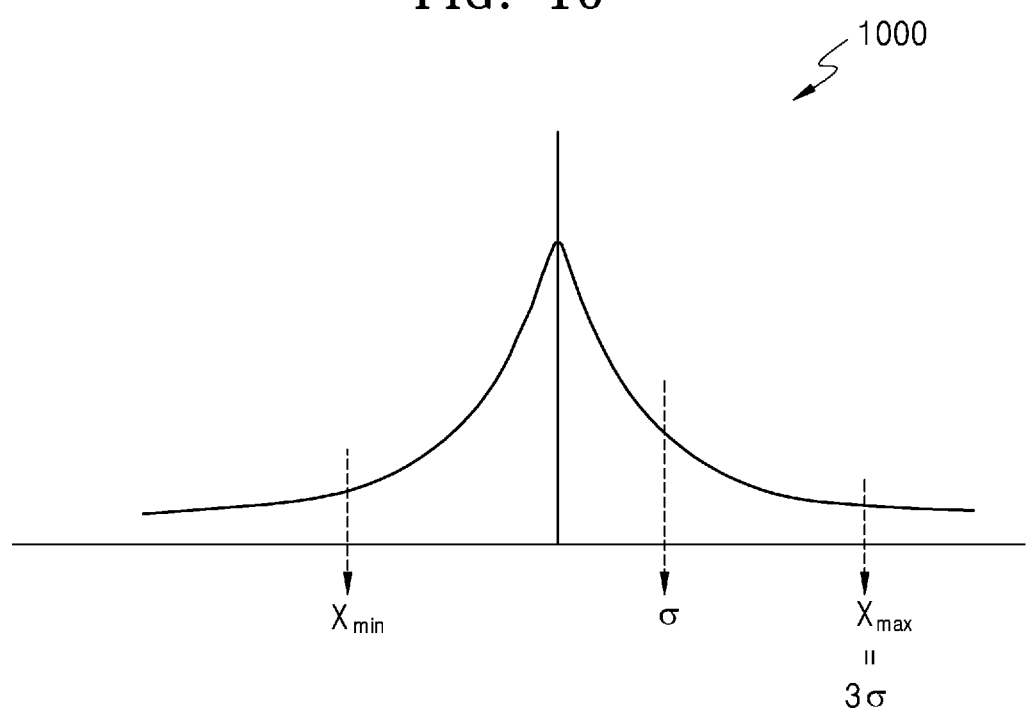
FIG. 10 is a graph showing another example of a statistical distribution of parameters used in a channel.

FIG. 10 is a graph showing another example of a statistical distribution of parameters used in a channel.

Referring to FIG. 10, instead of the normal distribution 900 of FIG. 9, the processor 110 normalizes the statistics for each channel with the PDF of a Laplace distribution 1000. The processor 110, as described with reference to FIG. 9, determines a fixed-point expression of parameters of a corresponding channel by obtaining the statistical maximum value $X_{max}$ and the statistical minimum value $X_{min}$ appropriate to the Laplace distribution 1000.

In other words, the processor 110, as described with reference to FIG. 9 or 10, analyzes a statistical distribution for each channel, and determines, from floating-point neural network parameters of each channel, the fixed-point expression of parameters for each channel based on the analyzed statistical distribution for each channel. The statistical distribution used by the processor 110 is a distribution approximated by the normal distribution or the Laplace distribution. However, as described above, the processor 110 may analyze the statistics using various other types of statistical distributions or probability distributions instead of the normal distribution or the Laplace distribution. In this state, the processor 110 determines the fixed-point expression based on the fractional length for each channel defined by using any one or any combination of any two or more of the mean, variance, standard deviation, maximum value, and minimum value of the floating-point values of the parameters distributed in a channel obtained from the statistical distribution for each channel.

Figure 11:
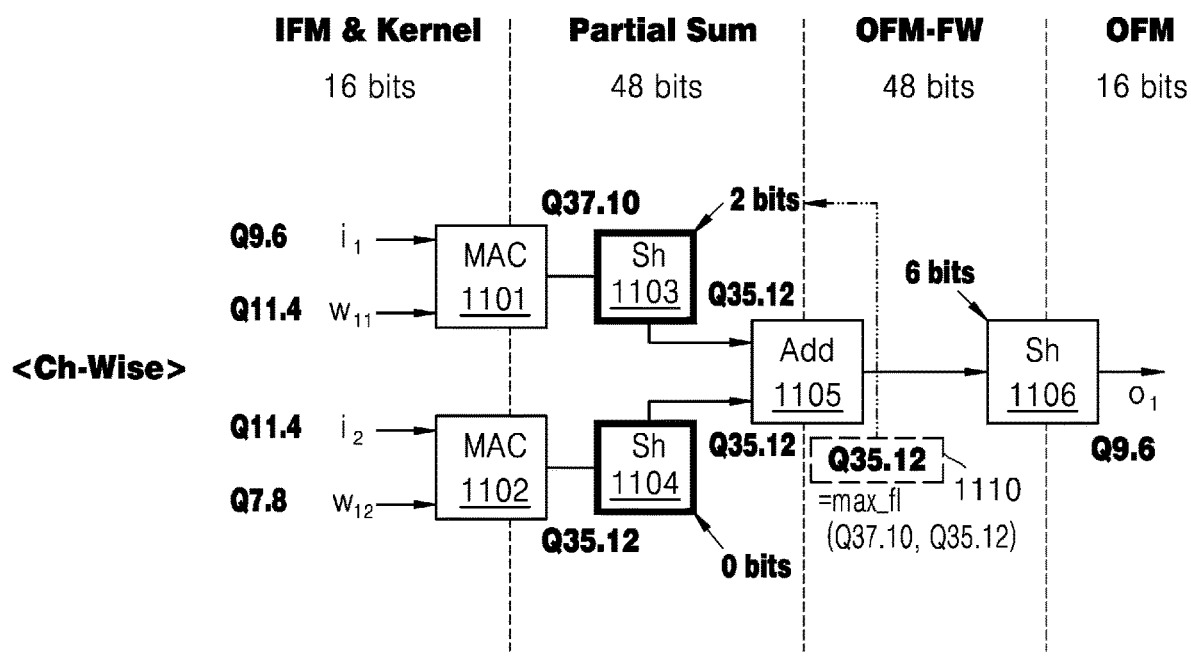
FIG. 11 illustrates an example of a method of determining the fractional lengths of fixed-point parameters in a channel-wise quantization of neural network parameters.

FIG. 11 illustrates an example of a method of determining the fractional length of fixed-point parameters in a channel-wise quantization of neural network parameters.

The processor 110 of FIG. 3 determines a fractional length of a bias 1110 after determining the fixed-point expressions of parameters of a neural network as described with reference to FIGS. 8 to 10.

Referring to FIG. 11, a convolution operation is performed between a first channel and a second channel of a layer of a neural network. The convolution operation includes a partial sum operation between a plurality of channels, and the partial sum operation includes a plurality of multiply-accumulate (MAC) operations and an Add operation. It is assumed that 16 bits are allotted to an input feature map (IFM) and a kernel, 48 bits are allotted to the partial sum operation, 48 bits are allotted to an output feature map full-width (OFM-FW) operation, and 16 bits are allotted to an output feature map (OFM).

The partial sum operation of FIG. 11 includes a first MAC operation 1101 between a first input activation $i_1$ of a first channel of the IFM and a first weight $w_{11}$ of a first channel of the kernel, a second MAC operation 1102 between a second input activation $i_2$ of a second channel of the IFM and a second weight $w_{12}$ of a second channel of the kernel, and an Add operation 1105 between a result of the first MAC operation 1101, a result of the second MAC operation 1102, and the bias 1110. For convenience of explanation, FIG. 11 does not illustrate operations between all channels of the IFM and all channels of the kernel, but illustrates operations between only two channels of the IFM and two channels of the kernel.

It is assumed that the first input activation $i_1$ is quantized to a fixed-point expression of Q9.6 having a fractional length of 6, the first weight $w_{11}$ is quantized to a fixed-point expression of Q11.4 having a fractional length of 4, the second input activation $i_2$ is quantized to a fixed-point expression of Q11.4 having a fractional length of 4, and the second weight $w_{12}$ is quantized to a fixed-point expression of Q7.8 having a fractional length of 8 as a result of determining the fixed-point expressions of parameters of a neural network as described with reference to FIGS. 8 to 10.

A fractional length of a result of a MAC operation is set to be equal to the sum of the fractional length of the input activation input to the MAC operation and the fractional length of the weight input to the MAC operation. Thus, a first fractional length of the result of the first MAC operation 1101 is set to 10, which is the sum of the fractional length of 6 of the first input activation $i_1$ and the fractional length of 4 of the first weight $w_{11}$. Also, a second fractional length of the result of the second MAC operation 1102 is set to 12, which is the sum of the fractional length of 4 of the second input activation $i_2$ and the fractional length of 8 of the second weight $w_{12}$.

The processor 110 performs the first MAC operation 1101 and obtains a first fixed-point expression of Q37.10 corresponding to a result of the first MAC operation 1101 and having the first fractional length of 10. Furthermore, the processor 110 performs the second MAC operation 1102 and obtains a second fixed-point expression of Q35.12 corresponding to a result of the second MAC operation 1102 and having the second fractional length of 12.

The processor 110 determines a maximum fractional length of the first fractional length of 10 and the second fractional length of 12 to be a fractional length of a result of the Add operation 1105 and a fractional length of a bias 1110 that is used in the Add operation 1105. Accordingly, the processor 110 determines the result of the Add operation 1105 and the bias 11100 to have a fixed-point expression of Q35.12. Before performing the Add operation, the fractional length of a fixed-point expression having a minimum fractional length among the first fixed-point expression and the second fixed-point expression is bit-shifted by a difference between the first fractional length of 10 and the second fractional length of 12.

In detail, the processor 110 determines the second fractional length of 12 that is the maximum fractional length among the first fractional length of 10 and the second fractional length of 12 to be a fractional length of 12 of the result of the Add operation 1105 and the bias 1110. Before performing the Add operation 1105, the processor 110 bit-shifts the first fractional length of 10 of the first fixed-point expression of Q37.10 having a minimum fractional length among the first fractional length of 10 and the second fractional length of 12 by 2 bits, which is the difference between the first fractional length of 10 and the second fractional length of 12, using a first bit-shifter 1103 to obtain a fixed-point expression of Q35.12 corresponding to the result of the first MAC operation 1103.

To perform bit-shifting on the results of the first and second MAC operations 1101 and 1102, the processor 110 includes the first bit-shifter 1103 and a second bit-shifter 1104. In the example illustrated in FIG. 11, the processor 110 shifts the second fractional length of 12 of the second fixed-point expression of Q35.12 by 0 bits using the second bit-shifter 1104.

It is assumed that an output activation $O_1$ of an output feature map OFM is quantized to a fixed-point expression of Q9.6 having a fractional length of 6 as a result of determining the fixed-point expressions of parameters of a neural network as described with reference to FIGS. 8 to 10. The processor 110 shifts the fractional length 12 of the fixed-point expression Q35.12 corresponding to the result of the Add operation 1105 by 6 bits, which is a difference between the fractional length of 12 of the result of the Add operation 1105 and the fractional length 6 of the output activation $O_1$, using a third bit-shifter 1106 to obtain the fixed-point expression of Q9.6 of the output activation $O_1$.

In the example of FIG. 11, the fractional length of the result of the Add operation 1105 and the fractional length of the bias 1110 determined by the processor 110 are a maximum fractional length of the fractional lengths of the fixed-point expressions obtained as a result of the first and second MAC operations 1101 and 1102. Although not illustrated in FIG. 11, if an upper limit of the fractional length of the result of the Add operation 1105 and the fractional length of the bias 1110 is predefined, the fractional length of the result of the Add operation 1105 and the fractional length of the bias 1110 are determined to be a smaller value of the maximum fractional length and the predefined upper limit of the fractional length (see operations 1206 and 1207 of FIG. 12).

Consequently, the processor 110 generates data of a quantized neural network, including information about the fixed-point expression of Q11.4 and the fractional length of 4 of the first weight $w_{11}$, the fixed-point expression of Q7.8 and the fractional length of 8 of the second weight $w_{12}$, the fixed-point expression of Q35.12 and the fractional length of 12 of the bias 1110, and amounts of bit-shifting performed by the first, second, and third bit-shifters 1103, 1104, and 1106 (the 2-bit bit-shifting performed by the bit-shifter 1103, the 0-bit bit-shifting performed by the bit-shifter 1104, and the 6-bit bit-shifting performed by the bit-shifter 1106).

Although FIG. 11 illustrates only two channels, the method of FIG. 11 is also applicable to a case in which there are three or more channels.

Figure 12:
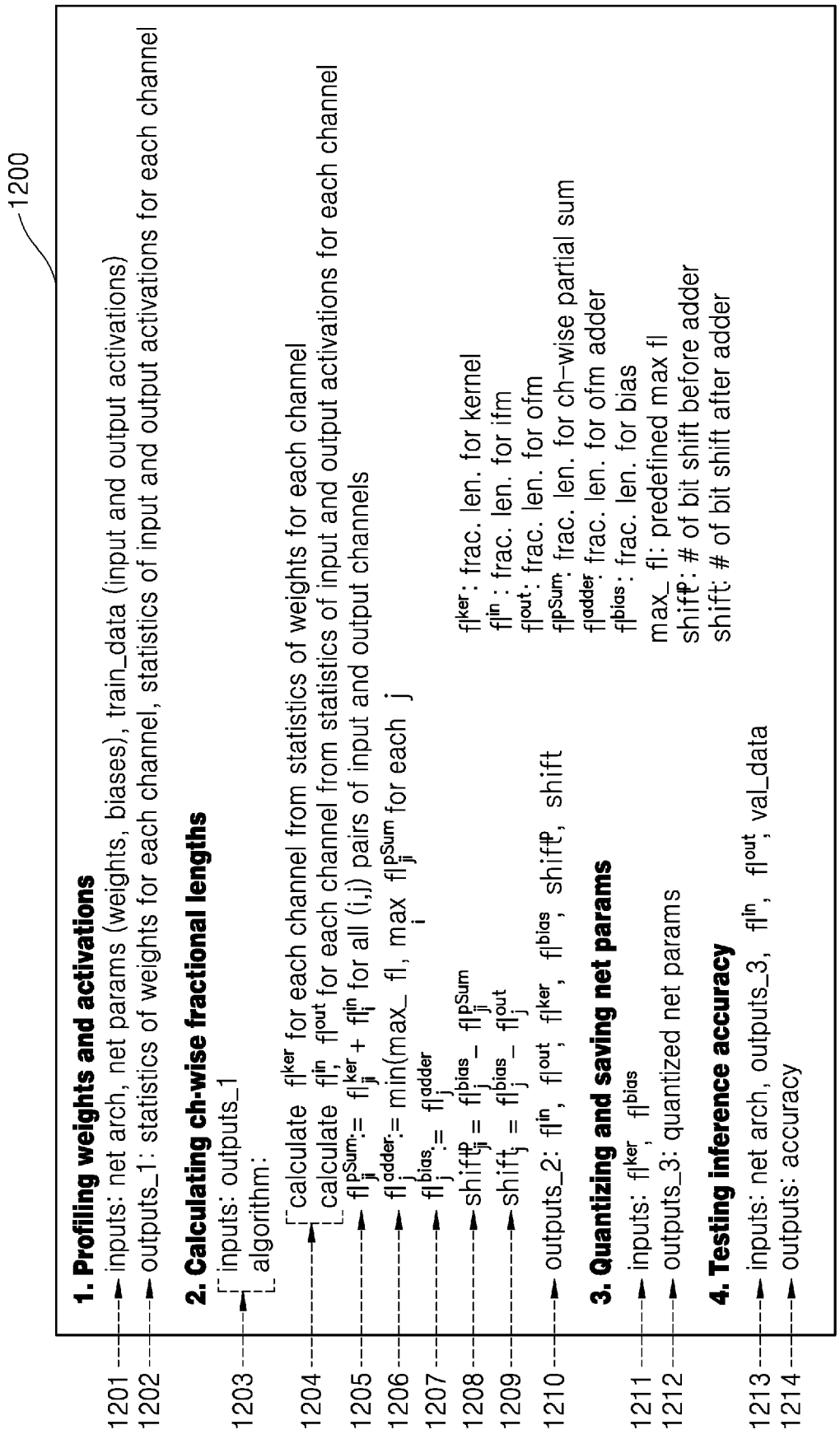
FIG. 12 illustrates an example of a channel-wise quantization algorithm of neural network parameters implementing the method of FIG. 11.

FIG. 12 illustrates an example of a channel-wise quantization algorithm of neural network parameters implementing the method of FIG. 11.

Referring to FIG. 12, a quantization algorithm 1200 implements the method of FIG. 11 to determine the fractional length of a bias.

In operation 1201, the processor 110 of FIG. 3 obtains, as inputs, neural network architecture data, neural network parameter data (weights and biases), and training data (input and output activations) of the pre-trained neural network data.

In operation 1202, the processor 110 outputs statistics of weights for each channel of a kernel obtained by analyzing a statistical distribution of the weights for each channel of the kernel on a channel-wise basis, and statistics of input and output activations for each channel of input and output feature maps obtained by analyzing a statistical distribution of the input and output activations for each channel of the input and output feature maps on a channel-wise basis.

In operation 1203, the processor 110 obtains the statistics output in operation 1202 as inputs for use in determining fractional lengths for each channel and quantizing floating-point parameters of the neural network.

In operation 1204, the processor 110 calculates a fractional length of the weights for each channel of the kernel from the statistics of the weights for each channel of the kernel, and converts a floating-point weight to a fixed-point weight having the calculated fractional length. Furthermore, the processor 110 calculates a fractional length of the input activations for each channel of an input feature map (IFM) and a fractional length of the output activations for each channel of an output feature map (OFM) from the statistics of the input and output activations for each channel, and converts a floating-point input activation to a fixed-point input activation having the calculated fractional length and converts a floating-point output activation to a fixed-point output activation having the calculated fractional length.

In operation 1205, the processor 110 determines a fractional length of a result of each MAC operation input to the Add operation to be equal to a sum of the fractional length of the weight input to the MAC operation and the fractional length of the input activation input to the MAC operation.

In operation 1206, the processor 110 determines the maximum fractional length among the fractional lengths of the results of the MAC operations input to the Add operation to be a fractional length of a result of the Add operation. When an upper limit of the fractional length of the Add operation is predefined, a minimum fractional length among the maximum fractional length and the predefined fractional length is determined to be the fractional length of the result of the Add operation.

In operation 1207, the processor 110 determines the fractional length of the result of the Add operation determined in operation 1206 to be the fractional length of the bias.

In operation 1208, the processor 110 bit-shifts the fractional length of each of the results of the MAC operations input to the Add operation by a difference between the fractional length of the bias and the fractional length of the result of the MAC operation.

In operation 1209, the processor 110 bit-shifts the fractional length of the result of the Add operation by a difference between the fractional length of the bias and the fractional length of the output activation of the OFM determined in operation 1204 to obtain the output activation of the OFM having the fractional length determined in operation 1204.

In operation 1210, the processor 110 outputs the fractional length of the input activations for each channel of the IFM, the fractional length of the output activations for each channel of the OFM, the fractional length of the weights for each channel of the kernel, the fractional length of the bias, the amounts of the bit-shifting in operation 1208, and the amount of the bit-shifting in operation 1209.

In operation 1211, the processor 110 obtains the fractional length of the weights for each channel of the kernel and the fractional length of the bias output in operation 1210 as inputs.

In operation 1212, the processor 110 quantizes floating-point weight and biases of the floating-point neural network to fixed-point weights and biases of a quantized neural network, and outputs the quantized fixed-point weights and biases as parameters of the quantized neural network.

In operation 1213, the processor obtains, as inputs, neural network architecture data of the quantized neural network, the quantized fixed-point weights and biases of the quantized neural network output in operation 1212, the fractional lengths of the input and output activations calculated in operation 1204, and validation data val_data.

In operation 1214, the processor 110 validates (tests) the accuracy of the quantized neural network using the input data obtained in operation 1213, and outputs the accuracy.

Figure 13:
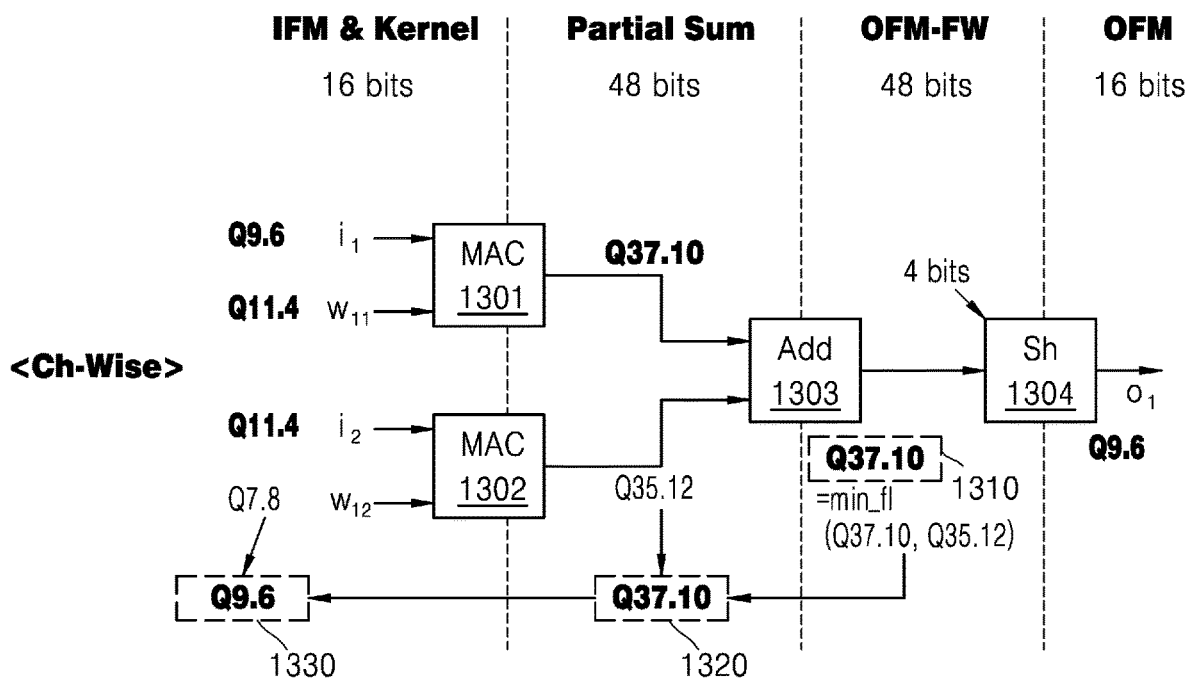
FIG. 13 illustrates another example of a method of determining the fractional lengths of fixed-point parameters in a channel-wise quantization of neural network parameters.

FIG. 13 illustrates another example of a method of determining the fractional lengths of fixed-point parameters in a channel-wise quantization of neural network parameters.

The processor 110 of FIG. 3 determines the fractional length of a bias 1310 and the fractional length of a weight 1330 after determining the fixed-point expressions of parameters of a neural network as described with reference to FIGS. 8 to 10. The method of determining fractional lengths according to FIG. 13 does not require the bit-shifting performed by the bit-shifters 1103 and 1104 of FIG. 11, so the method of FIG. 13 is different from the method described with reference to FIGS. 11 and 12.

In FIG. 13, the process of obtaining a first fixed-point expression of Q37.10 corresponding to a result of a first MAC operation 1301 and having a first fractional length of 10 and a second fixed-point expression of Q35.12 corresponding to a result of a second MAC operation 1302 and having a second fractional length of 12 is the same as that described with reference to FIG. 11.

Referring to FIG. 13, unlike FIG. 11, the processor 110 determines a minimum fractional length of 10 of the first fractional length of 10 and the second fractional length of 12 to be a fractional length 10 of a result of an Add operation 1303 and a fractional length 10 of the bias 1310 that is used in the Add operation 1303. Accordingly, the processor 110 determines the result of the Add operation 1303 and the bias 1310 to have a fixed-point expression of Q37.10. Furthermore, the processor 110 determines the existing second fixed-point expression of Q35.12 corresponding to the result of the second MAC operation 1302 and having an existing length of 12 to be tuned to a new second fixed-point expression 1320 of Q37.10 having a new fractional length of 10, and determines the existing fixed-point expression of Q7.8 of the second weight $w_{12}$ having an existing fractional length of 8 to be tuned to a new fixed-point expression 1330 of Q9.6 having a new fractional length of 6, which is equal to the existing fractional length of 8 minus a difference of 2 between the existing fractional length of 12 of the existing second fixed-point expression of Q35.12 corresponding to the result of the second MAC operation 1302 and the fractional length of 10 of the bias 1310. In other words, information about the determined fractional length of 10 of the bias 1310 is back-propagated, and accordingly the second weight $w_{12}$ quantized to the existing fixed-point expression of Q7.8 having the existing fractional length of 8 is requantized to the new fixed-point expression 1330 of Q9.6 having the new fractional length of 6, which causes the output of the second MAC operation 1302 to have the new second fixed-point expression of Q37.10 having the new fractional length of 10.

It is assumed that an output activation $O_1$ of an output feature map OFM is quantized to a fixed-point expression of Q9.6 having a fractional length of 6 as a result of determining the fixed-point expressions of parameters of a neural network as described with reference to FIGS. 8 to 10. The processor 110 shifts the fractional length 10 of the fixed-point expression Q37.10 corresponding to the result of the Add operation 1303 by 4 bits, which is a difference between the fractional length of 12 of the result of the Add operation 1105 and the fractional length of 6 of the output activation $O_1$, using a third bit-shifter 1106 to obtain the fixed-point expression of Q9.6 of the output activation $O_1$.

In the example of FIG. 13, the fractional length of a bias determined by the processor 110 is the minimum fractional length of the fractional lengths of the fixed-point expressions corresponding to results of the MAC operations.

Consequently, the processor 110 generates data of a quantized neural network, including information about the fixed-point expression of Q11.4 and the fractional length of 4 of the first weight $w_{11}$, the fixed-point expression of Q9.6 and the fractional length of 6 of the second weight $w_{12}$ 1330, the fixed-point expression of Q37.10 and the fractional length of 10 of the bias 1310, and an amount of bit-shifting performed by the bit-shifter 1304 (the 4-bit bit-shifting performed by the bit-shifter 1304).

Although FIG. 13 illustrates only two channels, the method of FIG. 13 is also applicable to a case in which there are three or more channels.

FIG. 14 illustrates another example of a channel-wise quantization algorithm of neural network parameters implementing the method of FIG. 13.

Referring to FIG. 14, a quantization algorithm 1400 implements the method of FIG. 13 to determine the fractional length of a bias.

Operations 1401 to 1405 are the same as operations 1201 to 1205 of FIG. 12, and thus will not be described here.

In operation 1406, the processor 110 determines a minimum fractional length among the fractional lengths of the results of the MAC operations input to the Add operation to be a fractional length of a result of the Add operation.

In operation 1407, the processor 110 determines the fractional length of the result of the Add operation determined in operation 1406 to be the fractional length of the bias.

In operation 1408, the processor 110 updates the fractional length of the weight for each channel by subtracting from the existing fractional length of the weight a difference between the existing fractional length of the result of the MAC operation that receives the weight as an input and the determined fractional length of the bias.

Operation 1409 is the same as operation 1209 in FIG. 12, and thus will not be described here.

In operation 1410, the processor 110 outputs the fractional length of the input activations for each channel of the IFM, the fractional length of the output activations for each channel of the OFM, the fractional length of the weights for each channel of the kernel, the fractional length of the bias, and the amount of the bit-shifting in operation 1409.

Operations 1411 to 1414 are the same as operations 1211 to 1214 of FIG. 12, and thus will not be described here.

The processor 110 performs quantization of a neural network by selecting either the method of FIGS. 11 and 12 or the method of FIGS. 13 and 14. For example, the processor 110 may select one of the methods based on the processing performance, the hardware architecture, and other characteristics of a device (a hardware accelerator) that deploys the quantized neural network, but the processor 110 is not limited thereto.

Figure 15:
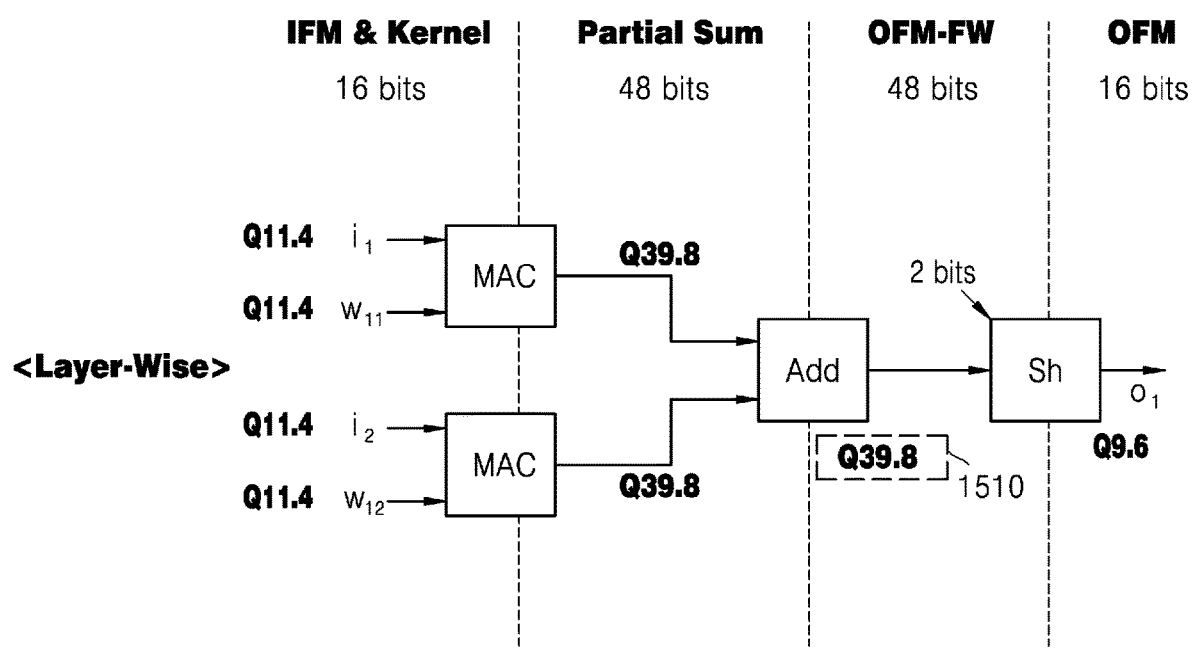
FIG. 15 illustrates an example of the layer-wise quantization described with reference to FIG. 7.

FIG. 15 illustrates an example of the layer-wise quantization described with reference to FIG. 7.

Referring to FIG. 15, as described with reference to FIG. 7, the input activations and the weights of all channels included in a layer are quantized to the same fixed-point expression of Q11.4 by the layer-wise quantization. In the example of FIG. 15, the fixed-point expression of a bias 1510 is Q39.8 and a fractional length thereof is 8. In other words, the fractional length of 8 of the bias 1510 is shorter than the fractional length of 12 of the bias 1110 determined by the method of FIGS. 11 and 12 and the fractional length of 10 of the bias 1310 determined by the method of FIGS. 13 and 14. Accordingly, it may be seen that the channel-wise methods of quantizing a neural network d illustrated in FIGS. 11 through 14 provides a more accurate and precise bias value than the layer-wise method of quantizing a neural network illustrated in FIGS. 7 and 15.

Figure 16:
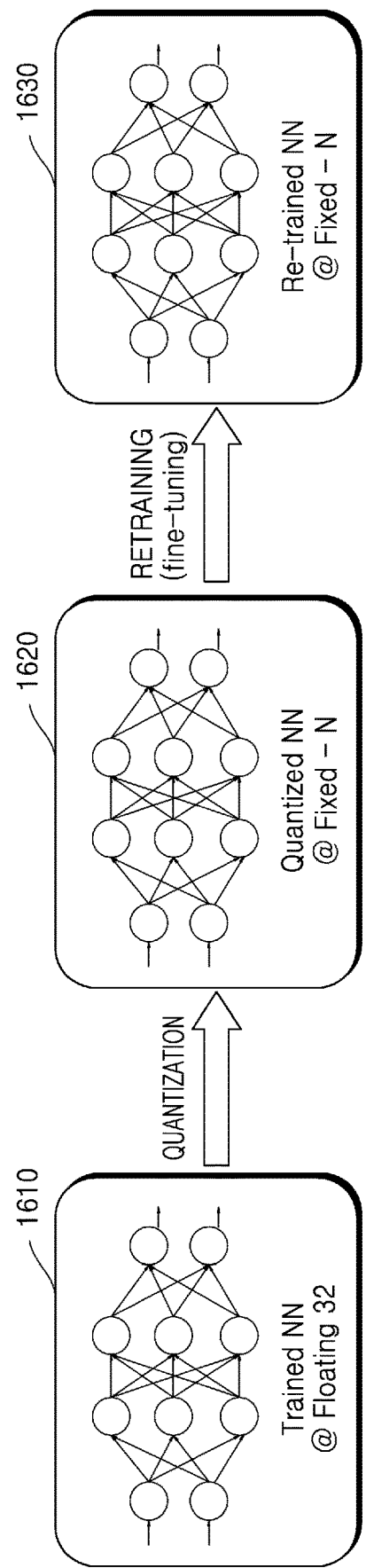
FIG. 16 illustrates an example of retraining a quantized neural network.

FIG. 16 illustrates an example of retraining a quantized neural network.

Referring to FIG. 16, the processor 110 of FIG. 3 quantizes a floating-point pre-trained neural network 1610 to a fixed-point neural network 1620. Furthermore, the processor 110 retrains the fixed-point type neural network 1620 using new or existing training set data and test set data to increase an accuracy of the quantized neural network 1620. As the fixed-point parameters of the quantized neural network 1620 are fine-tuned by the retraining, the processor 110 obtains a retrained neural network 1630 having an increased accuracy. In this state, the processor 110 retrains the quantized neural network 1620 with the fractional lengths determined for the bias and the weight for each channel set as constraints for the quantized neural network 1620 to fine tune the quantized neural network 1620. That is, the fractional lengths determined for the bias and the weight for each channel are not changed during the retraining of the quantized neural network 1620. The neural network quantization apparatus (10 of FIG. 3) transfers the retrained neural network 1630 to a neural network dedicated hardware accelerator that deploys the retrained neural network 1630.

Figure 17:
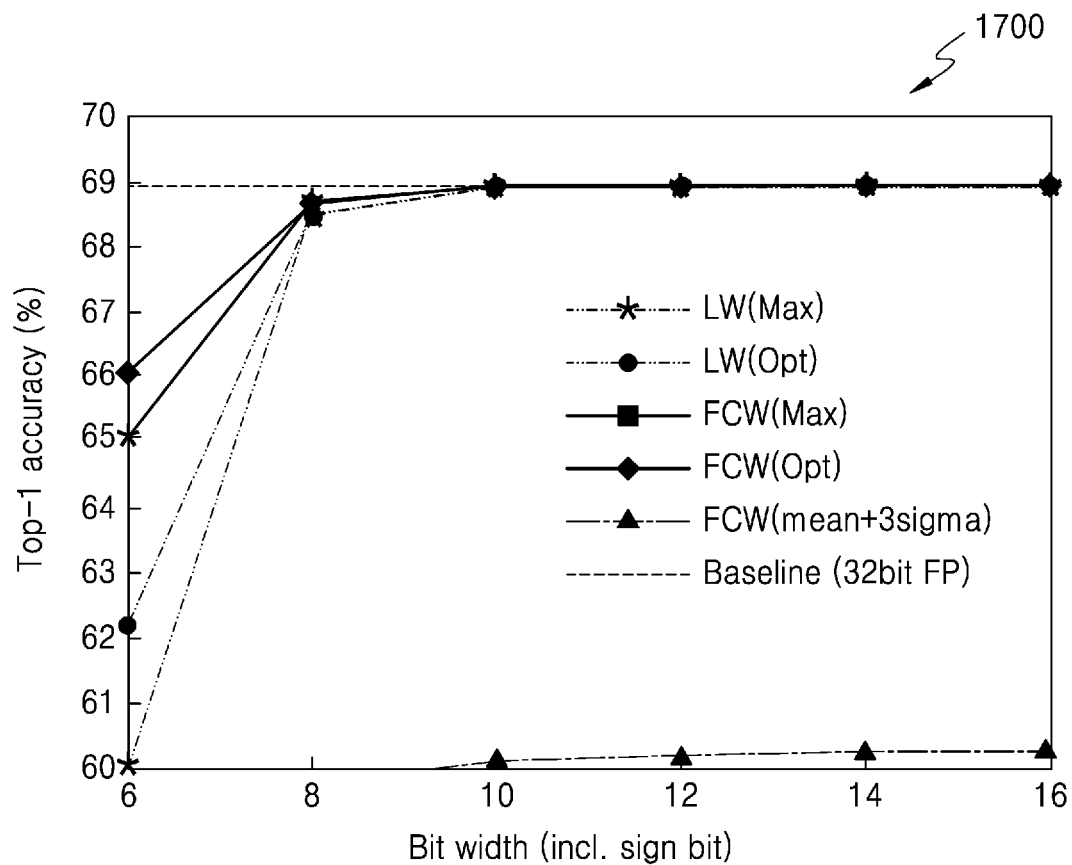
FIG. 17 is a graph showing an example of a simulation result of comparing an accuracy of the layer-wise quantization to an accuracy of the channel-wise quantization.

FIG. 17 is a graph showing an example of a simulation result of comparing an accuracy of the layer-wise quantization to an accuracy of the channel-wise quantization.

Referring to FIG. 17, as an allotted bit width increases, the accuracy of the layer-wise quantization and the accuracy of the channel-wise quantization converge to a substantially the same value. However, as the allotted bit width decreases, a difference between the accuracy of the layer-wise quantization and the channel-wise quantization becomes noticeable. In detail, when a relatively small bit width is allotted, the accuracy of the channel-wise quantization is noticeably higher than the accuracy of the layer-wise quantization. When a neural network dedicated hardware accelerator is implemented by hardware having low performance and low power, a relatively small bit width is allotted. Accordingly, for the hardware accelerator, a more accurate result is obtained when a neural network is quantized by the channel-wise quantization. In addition, it may be seen that both the channel-wise quantization and the layer-wise quantization have a higher accuracy when performing the quantization using a quantization level of a method of minimizing a quantization error, such as optimal delta or mean plus three sigma, rather than a quantization based on an actual maximum value as a distribution range.

Figure 18:
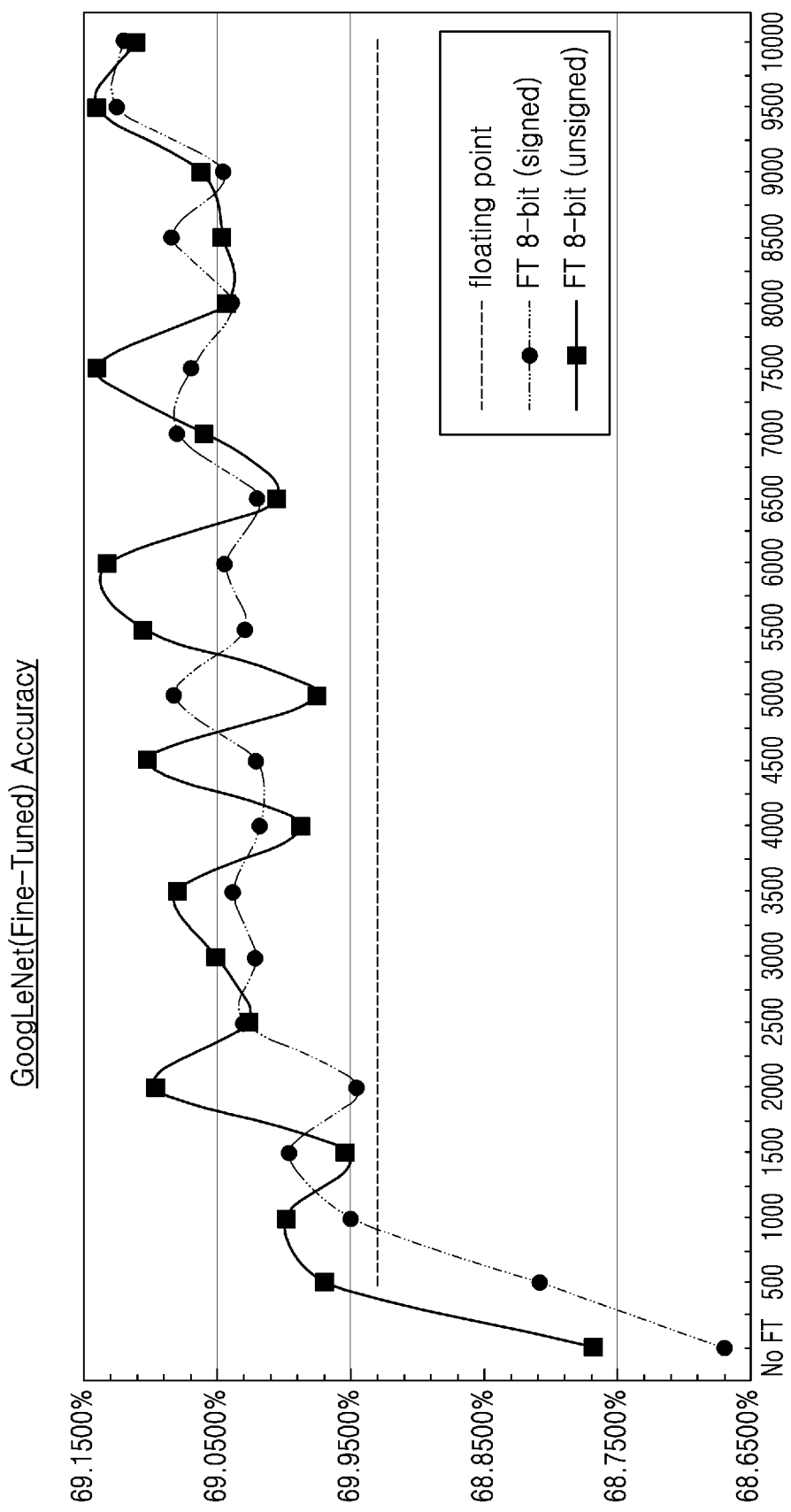
FIG. 18 is a graph showing an example of a simulation result of a change in an accuracy of a quantized neural network after retraining.

FIG. 18 is a graph showing an example of a simulation result of a change in an accuracy of a quantized neural network after retraining.

Referring to FIG. 18, even after a neural network has been quantized to a fixed-point neural network, an accuracy of the fixed-point neural network may be improved by retraining or fine tuning to be better than an accuracy of the floating-point neural network, which is shown as the straight dashed line in FIG. 18. "No FT" on the horizontal axis in FIG. 17 denotes "number of fine tunings." Thus, the horizontal axis in FIG. 18. shows the number of times the retraining or fine tuning was performed on the fixed-point neural network. The vertical axis in FIG. 18 shows the accuracy of the retrained fixed-point neural network.

Figure 19:
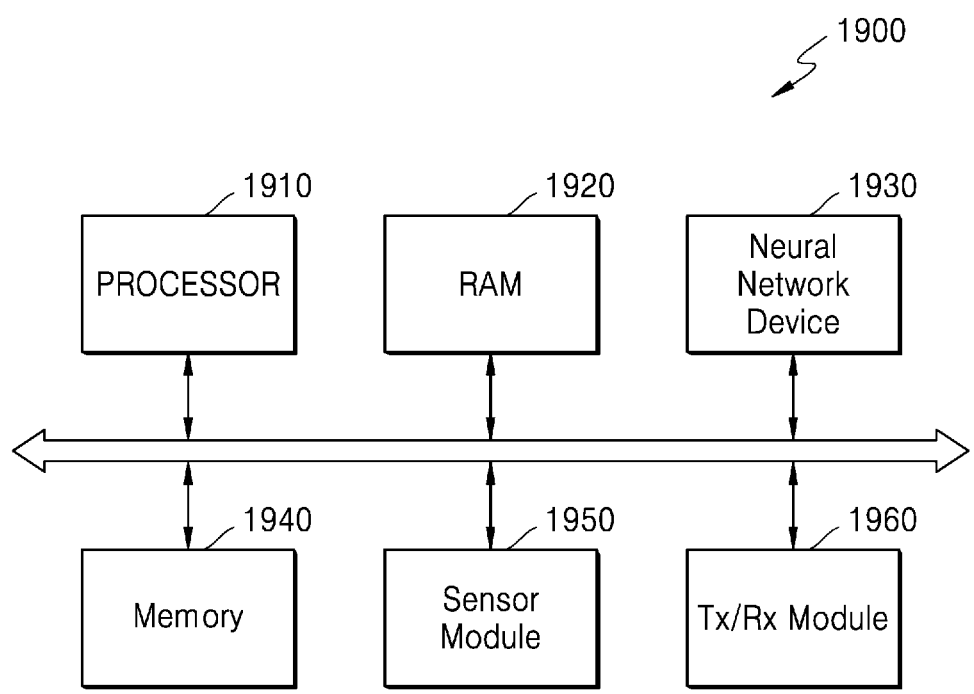
FIG. 19 is a block diagram of an example of an electronic system.

FIG. 19 is a block diagram of an example of an electronic system.

Referring to FIG. 19, an electronic system 1900 extracts information by analyzing input data in real time using a neural network, determines a situation based on the extracted information, and controls elements of an electronic device in which the electronic system 1900 is mounted based on the determined situation. For example, the electronic system 1900 may be applied to robot devices such as drones and advanced driver-assistance systems (ADAS), smart TVs, smart phones, medical devices, mobile devices, image display devices, measuring devices, and IoT devices, and may also be mounted in any of various types of electronic devices.

The electronic system 1900 includes a processor 1910, a RAM 1920, a neural network device 1930, a memory 1940, a sensor module 1950, and a communication (Tx/Rx) module 1960. Although not illustrated in FIG. 19, the electronic system 1900 may further include one or more other elements, such as an input/output module, a security module, and a power control device. Some hardware components of the electronic system 1900 may be mounted on at least one semiconductor chip. The neural network device 1930 may include the above-described neural network dedicated hardware accelerator or a device including the neural network dedicated hardware accelerator.

The processor 1910 controls all operations of the electronic system 1900. The processor 1910 may be a single-core processor or a multi-core processor. The processor 1910 processes or executes programs and/or data stored in the memory 1940. In one example, the processor 1910 controls functions of the neural network device 1930 by executing the programs stored in the memory 1940. The processor 1910 may be implemented by a CPU, a GPU, or an AP, for example.

The RAM 1920 temporarily stores programs, data, or instructions. For example, the programs and/or data stored in the memory 1940 may be temporarily stored in the RAM 1920 according to a boot code or the control of the processor 1910. The RAM 1920 may be implemented by memory such as dynamic RAM (DRAM) or static RAM (SRAM).

The neural network device 1930 performs an operation of a neural network based on the received input data, and generates an information signal based on a result of the operation. The neural network may be a CNN, an RNN, a deep belief network, or a restricted Boltzman machine, but is not limited thereto. The neural network device 1930 is a hardware device that performs a process using a neural network that has been quantized to the above-described fixed-point neural network, and may correspond to the above-described neural network dedicated hardware accelerator.

The information signal may be any one of various types of recognition signals such as a voice recognition signal, an object recognition signal, an image recognition signal, or a biometric information recognition signal. In one example, the neural network device 1930 receives frame data included in a video stream as input data, and generates from the frame data a recognition signal for an object included in an image indicated by the frame data. However, the neural network device 1930 is not limited thereto, and the neural network device 1930 may receive other types of input data and generate a recognition signal according to the input data, depending on the type or function of an electronic device in which the electronic system 1900 is mounted.

The memory 1940 is a storage for storing data, such as an operating system (OS), various programs, and various pieces of data. In one example, the memory 1940 stores intermediate results generated in an operation of the neural network device 1930, such as an output feature map. In one example, the memory 1940 stores a compressed output feature map. Furthermore, the memory 1940 may store quantized neural network data, such as parameters, weight maps, or a weight list, that are used by the neural network device 1930.

The memory 1940 may be a DRAM, but is not limited thereto. The memory 1940 may include either one or both of a volatile memory and a nonvolatile memory. Examples of the nonvolatile memory include ROM, PROM, EPROM, EEPROM, flash memory, PRAM, MRAM, RRAM, and FeRAM. Examples of the volatile memory include DRAM, SRAM, SDRAM, PRAM, MRAM, RRAM, and FeRAM. In one example, the memory 1940 may include any one or any combination of any two or more of HDD, SSD, CF, SD, microSD, miniSD, and Memory Stick.

The sensor module 1950 collects information about the surroundings of the electronic device in which the electronic system 1900 is mounted. The sensor module 1950 senses or receives a signal, such as an image signal, a voice signal, a magnetic signal, a biometric signal, or a touch signal, from outside the electronic device, and converts the sensed or received signal to data. To this end, the sensor module 1950 any one or any combination of any two or more of various types of sensing devices, such as a microphone, an imaging device, an image sensor, a light detection and ranging (LIDAR) sensor, an ultrasonic sensor, an infrared sensor, a biosensor, or a touch sensor.

The sensor module 1950 provides the neural network device 1930 with the converted data as input data. In one example, the sensor module 1950 includes an image sensor, generates a video stream by photographing the external environment of the electronic device, and provides the neural network device 1930 with consecutive data frames of the video stream in order as input data. However, the sensor module 1950 is not limited thereto, and the sensor module 1950 may provide other types of data to the neural network device 1930.

The communication module 1960 includes various wired or wireless interfaces capable of communicating with external devices. For example, the communication module 1960 may include a local area network (LAN), a wireless local area network (WLAN) such as Wi-Fi™, a wireless personal area network (WPAN) such as Bluetooth™, a wireless universal serial bus (USB), ZigBee™, near-field communication (NFC), radio-frequency identification (RFID), power-line communication (PLC), or a communication interface capable of connecting to a mobile cellular network such as 3rd generation (3G), 4th generation (4G), or long-term evolution (LTE).

In one example, the communication module 1960 receives data of a quantized neural network from the external device. The external device may be a device, such as the neural network quantization apparatus 10 of FIG. 3, that trains a neural network based on a large amount of data, quantizes the trained neural network to a fixed-point neural network, and provides the quantized neural network data to the electronic system 1900. The received quantized neural network data is stored in the memory 1940.

Figure 20:
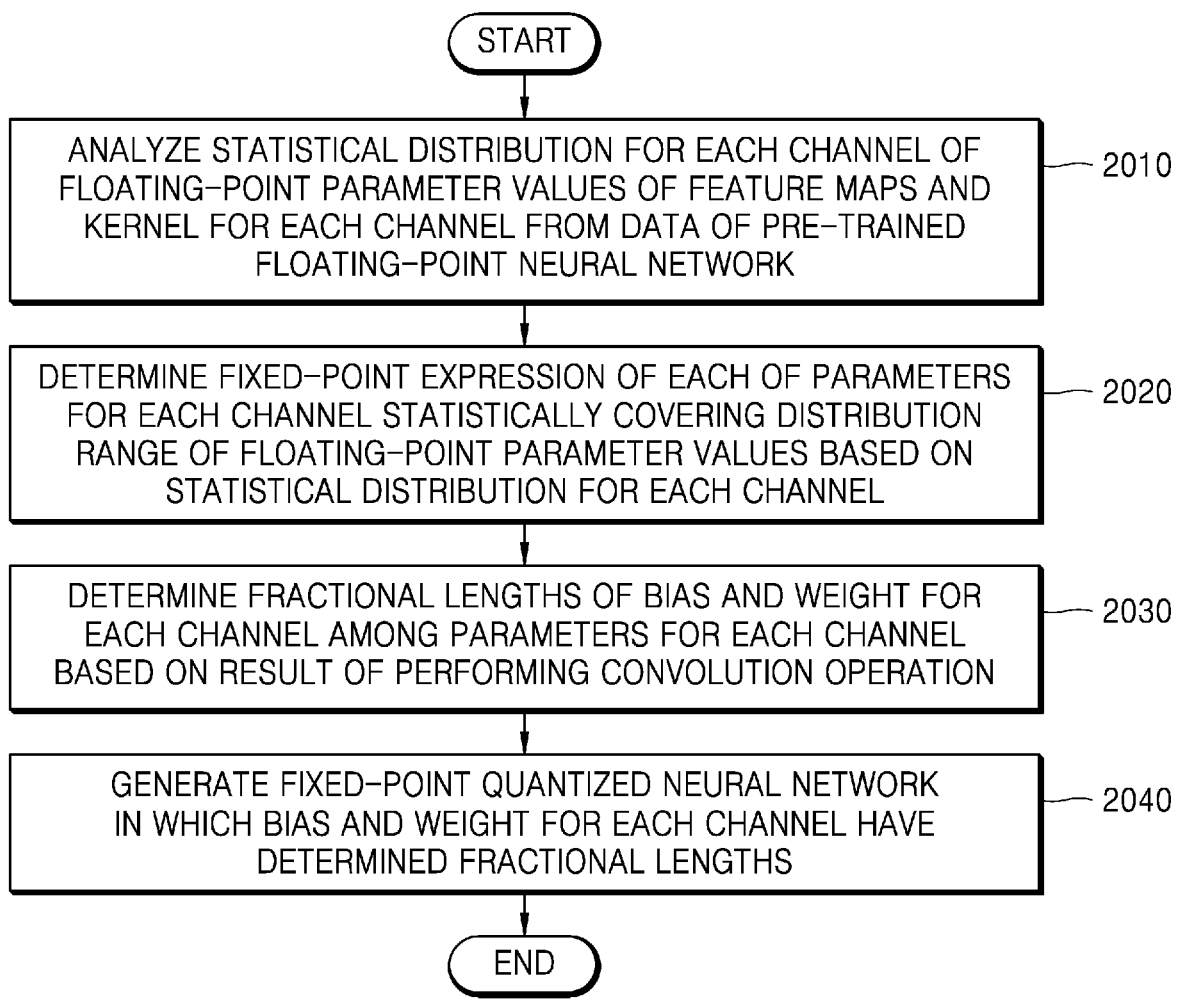
FIG. 20 is a flowchart of an example of a channel-wise method of quantizing parameters of a neural network.

FIG. 20 is a flowchart of an example of a channel-wise method of quantizing parameters of a neural network.

The channel-wise method of quantizing parameters of a neural network illustrated in FIG. 20 relates to the examples described above with respect to FIGS. 1-6, 8-14, and 16-19. Accordingly, the descriptions of FIGS. 1-6, 8-14, and 16-19 are also applicable to the method of FIG. 20, and thus will not be repeated here.

In operation 2010, the processor 110 analyzes a statistical distribution for each channel of floating-point parameter values of feature maps and a kernel for each channel from data of a pre-trained floating-point neural network.

In operation 2020, the processor 110 determines a fixed-point expression of each of the parameters for each channel statistically covering a distribution range of the floating-point parameter values based on the statistical distribution for each channel.

In operation 2030, the processor 110 determines fractional lengths of a bias and a weight for each channel among the parameters for each channel based on a result of performing a convolution operation.

In operation 2040, the processor 110 generates a fixed-point quantized neural network in which the bias and the weight for each channel have the determined fractional lengths.

The neural network quantization apparatus 10, the processor 110, and the memory 120 in FIG. 3, the graphics processing unit (GPU) and the neural processing unit (NPU) in FIG. 4, and the electronic system 1900, the processor 1910, the RAM 1920, the neural network device 1930, the memory 1940, the sensor module 1950, and the communication (Tx/Rx) module 1960 in FIG. 19 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1, 2, 8, 11-14, 16, and 20 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of generating a fixed-point quantized neural network, the method comprising:

analyzing a statistical distribution of floating-point values for each channel of feature maps and a kernel for each channel from data of a pre-trained floating-point neural network;

quantizing the floating-point values for each channel to fixed-point values for each channel based on the statistical distribution for each channel;

determining fractional lengths of fixed-point expressions of parameters for performing an operation of the quantized fixed-point values, for each channel; and generating a fixed-point quantized neural network in which the parameters for each channel have the determined fractional lengths being different for at least some channels, including performing a channel-wise quantization for each channel included in the pre-trained floating-point neural network, wherein the determining of the fractional lengths comprises determining a fractional length of a bias for each channel based on fractional lengths of input activations and fractional lengths of weights for each channel input to multiply-accumulate (MAC) operations, and the determining of the fractional lengths further comprises determining a fractional length of a weight of the weights for each channel by decreasing the fractional length of the weight by a difference between the fractional length of one of the fixed-point expressions corresponding to a result of one of the MAC operations to which the weight was input and the determined fractional length of the bias.

2. The method of claim 1, wherein the analyzing of the statistical distribution comprises obtaining statistics for each channel of the floating-point values of weights, input activations, and output activations used in each channel during pre-training of the pre-trained floating-point neural network.

3. The method of claim 1, wherein the operation comprises a partial sum operation of a convolution operation between a plurality of channels,
the partial sum operation comprises a plurality of multiply-accumulate (MAC) operations and an Add operation,
the parameters comprise the bias and the weight for each channel.

4. The method of claim 3, wherein the determining of the fractional length of the bias comprises determining the fractional length of the bias based on a maximum fractional length among fractional lengths of fixed-point expressions corresponding to results of the MAC operations.

5. The method of claim 4, wherein
the partial sum operation comprises:
a first MAC operation between a first input activation of a first channel of an input feature map of the feature maps and a first weight of a first channel of the kernel;
a second MAC operation between a second input activation of a second channel of the input feature map and a second weight of a second channel of the kernel; and
an Add operation between a result of the first MAC operation, a result of the second MAC operation, and the bias, and
the determining of the fractional length of the bias further comprises:
obtaining a first fractional length of a first fixed-point expression corresponding to the result of the first MAC operation;
obtaining a second fractional length of a second fixed-point expression corresponding to the result of the second MAC operation; and
determining the fractional length of the bias to be a maximum fractional length among the first fractional length and the second fractional length.

6. The method of claim 5, further comprising bit-shifting a fractional length of a fixed-point expression having a smaller fractional length among the first fixed-point expression and the second fixed-point expression based on the determined fractional length of the bias,
wherein the fixed-point quantized neural network comprises information about an amount of the bit-shifting.

7. The method of claim 3, wherein
the determining of the fractional length of the bias comprises determining the fractional length of the bias to be a minimum fractional length among fractional lengths of fixed-point expressions respectively corresponding to results of the MAC operations.

8. The method of claim 3, wherein
the partial sum operation comprises:
a first MAC operation between a first input activation of a first channel of an input feature map of the feature maps and a first weight of a first channel of the kernel;
a second MAC operation between a second input activation of a second channel of the input feature map and a second weight of a second channel of the kernel; and
an Add operation between a result of the first MAC operation, a result of the second MAC operation, and the bias,
the determining of the fractional lengths further comprises:
obtaining a first fractional length of a first fixed-point expression corresponding to the result of the first MAC operation; and
obtaining a second fractional length of a second fixed-point expression corresponding to the result of the second MAC operation,
the determining of the fractional length of the bias comprises determining the fractional length of the bias to be a minimum fractional length among the first fractional length and the second fractional length, and
the determining of the fractional lengths further comprises tuning a fractional length of the weight input to one of the first MAC operation and the second MAC operation that produces a result having a fixed-point expression having the minimum fractional length by decreasing the fractional length of the weight by a difference between the first fractional length and the second fractional length.

9. The method of claim 1, wherein the statistical distribution for each channel is a distribution approximated by a normal distribution or a Laplace distribution, and
the quantizing of the floating-point values comprises determining fixed-point expression of the fixed-point values based on a fractional length for each channel determined based on any one or any combination of any two or more of a mean, a variance, a standard deviation, a maximum value, and a minimum value of the floating-point values for each channel obtained from the statistical distribution for each channel.

10. The method of claim 1, further comprising retraining, after the determining of the fractional lengths is completed, the fixed-point quantized neural network with the determined fractional lengths of the parameters for each channel set as constraints of the fixed-point quantized neural network to fine tune the fixed-point quantized neural network.

11. An apparatus for generating a fixed-point quantized neural network, the apparatus comprising:
a memory configured to store at least one program; and
a processor configured to execute the at least one program, wherein the processor executing the at least one program configures the processor to:
analyze a statistical distribution of floating-point values for each channel of feature maps and a kernel for each channel from data of a pre-trained floating-point neural network,
quantize the floating-point values for each channel to fixed-point values for each channel based on the statistical distribution for each channel,
determine fractional lengths of fixed-point expressions of parameters for performing an operation of the quantized fixed-point values, for each channel, and
generate a fixed-point quantized neural network in which the parameters for each channel have the determined fractional lengths being different for at least some channels, including performing a channel-wise quantization for each channel included in the pre-trained floating-point neural network, wherein
the determining of the fractional lengths comprises determining a fractional length of a bias for each channel based on fractional lengths of input activations and fractional lengths of weights for each channel input to multiply-accumulate (MAC) operations, and the determining of the fractional lengths further comprises determining a fractional length of a weight of the weights for each channel by decreasing the fractional length of the weight by a difference between the fractional length of one of the fixed-point expressions corresponding to a result of one of the MAC operations to which the weight was input and the determined fractional length of the bias.

12. The apparatus of claim 11, wherein the processor is further configured to analyze the statistical distribution by obtaining statistics for each channel of the floating-point values of weights, input activations, and output applications used in each channel during pre-training of the pre-trained floating-point neural network.

13. The apparatus of claim 11, wherein the operation comprises a partial sum operation of a convolution operation between a plurality of channels,
the partial sum operation comprises a plurality of multiply-accumulate (MAC) operations and an Add operation, and
the parameters comprise the bias and the weight for each channel.

14. The apparatus of claim 13, wherein the processor is further configured to determine the fractional length of the bias based on a maximum fractional length among fractional lengths of fixed-point expressions corresponding to results of the MAC operations.

15. The apparatus of claim 14, wherein
the partial sum operation comprises:
a first MAC operation between a first input activation of a first channel of an input feature map of the feature maps and a first weight of a first channel of the kernel;
a second MAC operation between a second input activation of the input feature map and a second weight of a second channel of the kernel; and
an Add operation between a result of the first MAC operation, a result of the second MAC operation, and the bias, and
the processor is further configured to:
obtain a first fractional length of a first fixed-point expression corresponding to the result of the first MAC operation,
obtain a second fractional length of a second fixed-point expression corresponding to the result of the second MAC operation, and
determine the fractional length of the bias to be a maximum fractional length among the first fractional length and the second fractional length.

16. The apparatus of claim 15, wherein
the processor is further configured to bit-shift a fractional length of a fixed-point expression having a smaller fractional length among the first fixed-point expression and the second fixed-point expression based on the determined fractional length of the bias, and the fixed-point quantized neural network comprises information about an amount of the bit-shifting.

17. The apparatus of claim 13, wherein
the processor is further configured to:
determine the fractional length of the bias to be a minimum fractional length among fractional lengths of fixed-point expressions respectively corresponding to results of the MAC operations.

18. The apparatus of claim 13, wherein
the partial sum operation comprises:
a first MAC operation between a first input activation of an input feature map of the feature maps and a first weight of a first channel of the kernel;
a second MAC operation between a second input activation of a second channel of the input feature map and a second weight of a second channel of the kernel; and
an Add operation between a result of the first MAC operation, a result of the second MAC operation, and the bias, and
the processor is further configured to:
obtain a first fractional length of a first fixed-point expression corresponding to the result of the first MAC operation,
obtain a second fractional length of a second fixed-point expression corresponding to the result of the second MAC operation,
determine the fractional length of the bias to be a minimum fractional length among the first fractional length and the second fractional length, and
tune a fractional length of the weight input to one of the first MAC operation and the second MAC operation that produces a result having a fixed-point expression having the minimum fractional length by decreasing the fractional length of the weight by a difference between the first fractional length and the second fractional length.

19. The apparatus of claim 11, wherein the statistical distribution for each channel is a distribution approximated a normal distribution or a Laplace distribution, and
the processor is further configured to determine fixed-point expression of the fixed-point values based on a fractional length for each channel determined based on any one or any combination of any two or more of a mean, a variance, a standard deviation, a maximum value, and a minimum value of the floating-point values for each channel obtained from the statistical distribution for each channel.

20. The apparatus of claim 11, wherein the processor is further configured to retrain, after the determining of the fractional lengths is completed, the fixed-point quantized neural network with the determined fractional lengths of the parameters for each channel set as constraints of the fixed-point quantized neural network to fine tune the fixed-point quantized neural network.

* * * * *